(12) United States Patent
Nakasugi

(10) Patent No.: US 6,507,034 B1
(45) Date of Patent: Jan. 14, 2003

(54) CHARGE BEAM EXPOSURE APPARATUS, CHARGE BEAM EXPOSURE METHOD, AND CHARGE BEAM EXPOSURE MASK

(75) Inventor: Tetsuro Nakasugi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 287 days.

(21) Appl. No.: 09/658,506

(22) Filed: Sep. 8, 2000

(30) Foreign Application Priority Data

Sep. 10, 1999 (JP) .......................... 11-257280

(51) Int. Cl.⁷ .............................................. H01J 37/304
(52) U.S. Cl. .............................. 250/492.22; 250/491.1; 250/397
(58) Field of Search ...................... 250/492.2, 492.22, 250/492.23, 398, 397, 491.1

(56) References Cited

U.S. PATENT DOCUMENTS 5,689,117 A  * 11/1997 Nakasuji ............... 250/492.23
5,973,333 A  * 10/1999 Nakasuji ............... 250/492.23
6,218,058 B1 *  4/2001 Yahiro et al. ................ 430/5
6,225,637 B1 *  5/2001 Terashima et al. ....... 250/492.2
6,350,992 B1 *  2/2002 Manabe et al. ........ 250/492.22

FOREIGN PATENT DOCUMENTS

| JP | 2837515 | 10/1998 |
| JP | 2918051 | 4/1999 |
| JP | 3064375 | 5/2000 |
| JP | 2000243683 A | * 9/2000 |

* cited by examiner

Primary Examiner—Bruce Anderson
(74) Attorney, Agent, or Firm—Finnegan, Henderson, Farabow, Garrett & Dunner, L.L.P.

(57) ABSTRACT

There are provided a second aperture having a beam adjustment opening group and a pattern exposure opening group, a stage for mounting a wafer to which a pattern should be transferred, and a control computer for controlling an electron beam to be irradiated onto the wafer. The control computer has a drawing parameter table which stores an optimum beam adjustment parameter for an electron beam using a pattern density as a parameter. A pattern is transferred by selecting an optimum beam adjustment parameter corresponding to the pattern density from the drawing parameter table for each pattern.

21 Claims, 20 Drawing Sheets

CHARGE BEAM EXPOSURE APPARATUS, CHARGE BEAM EXPOSURE METHOD, AND CHARGE BEAM EXPOSURE MASK

CROSS-REFERENCE TO RELATED APPLICATIONS

This application is based upon and claims the benefit of priority from the prior Japanese Patent Application No. 11-257280, filed Sep. 10, 1999, the entire contents of which are incorporated herein by reference.

BACKGROUND OF THE INVENTION

The present invention relates to a charge beam exposure apparatus, a charge beam exposure method, and an charge beam exposure mask for adjusting beams and exposing patterns according to patterns to be exposed.

Conventionally, a character projection exposure system (referred to hereafter as a CP exposure system) and a scanning exposure system are designed as exposure systems using an electron beam.

First, the following explains the CP exposure system using a schematic diagram in FIG. 1. As shown in FIG. 1, a region as large as several micrometers including a plurality of figures is formed as CP apertures 101a through 101e on a second formation aperture 101. The CP exposure system collectively exposes these CP apertures 101a through 101e. This exposure system is assumed to be promising as means for improving throughput. Specifically, an electron beam irradiated from an electron gun 11 is formed to a specified shaped through a first aperture 13. The shaped electron beam enters a second aperture 101. Specified CP apertures 101a through 10le are selected from the second aperture 101, forming an electronic image having a pattern composed of the selected CP apertures 101a through 101e. This electronic image is collectively exposed on a wafer 19.

When the CP exposure is used, a total electric current amount for beams varies with an opening area or an area for collective exposure. When a CP aperture which is 5 by 5 micrometers square is used for exposure, for example, a focus position fluctuates approximately up to 30 micrometers compared to an ordinary Variable Shaped Beam (VSB). Accordingly, the CP exposure requires the focus position optimization which is unnecessary for the VSB system.

For example, Jpn. Pat. Appln KOKAI Publication No. 2837515 discloses a beam adjustment method for such an electron beam exposure apparatus. FIG. 2 shows a structure of the second aperture used for the adjustment method described in this Jpn. Pat. Appln KOKAI Publication. A second aperture 201 is provided with a rectangular aperture 203 and an optical axis adjustment opening 204 in addition to a pattern exposure opening 202. In the conventional method, the optical axis adjustment opening 204 is used to adjust an optical axis.

However, this beam adjustment method has the following problems.

The conventional method uses an optical axis adjustment opening 204 to perform a beam adjustment for adjusting a beam focus and a beam deflection amount depending on a change in beam currents by varying an amount of beams that pass through rectangular apertures 203.

However, this beam adjustment method is available only when an unsimplified electro-optic system is used. FIG. 3A illustrates an apparatus structure for an unsimplified electro-optic system. FIG. 3B illustrates an apparatus structure for a simplified electro-optic system. These figures use an electron gun 161, a capacitor lens 162, a first aperture 163, a formation lens 164, a second aperture 165, a reduction lens 166, an objective lens 167, and a sample 168.

The simplified electro-optic system in FIG. 3B can be used when the scanning exposure system is used or the CP system is used for exposing all patterns. Namely, when the scanning exposure system is used or the CP system is used for exposing all patterns, it is unnecessary to form a first aperture image on a second aperture image. Accordingly, the formation lens 164 in FIG. 3A is unnecessary.

Here, an external edge of a rectangular aperture is referred to as an aperture edge. An edge of an electron beam is referred to as a beam edge. For decreasing a beam amount, a beam is irradiated to only part of the aperture edge. When the beam is irradiated so as to overlap the rectangular aperture, the beam edge is shaded by the rectangular aperture. When the beam is irradiated to only part of the aperture edge, the electron beam at the beam edge is also transferred onto the wafer 19. A beam at this beam edge is defocused on the wafer 19. This beam defocusing degrades the beam adjustment accuracy. Namely, the conventional beam adjustment is applicable only for the electro-optic system in FIG. 3A, in which the formation lens 164 is used for forming the first aperture image and the projection lens 166 and the objective lens 167 are used for forming the second aperture image on the sample surface. Apparently, the method in FIG. 3A is incapable of a beam adjustment according to variations in beam current amounts for the optical system in FIG. 3B.

The following describes a second problem with reference to FIGS. 4A and 4B. When the exposure apparatus in FIG. 1 is used for beam adjustment, a heavy metal dot 111 in FIG. 4A is provided on the wafer 19 or a stage (not shown) where the wafer 19 is placed. A CP-shaped electron beam 12 is applied to this heavy metal dot 111 through the use of surface scanning. The electron beam 12 is irradiated to shaded regions. An operation is performed to find a two-dimensional beam intensity distribution obtained by this surface scanning. Further, an operation is performed to find an ideal two-dimensional beam intensity distribution.

After the surface scanning, a beam adjustment is performed using this ideal intensity distribution as a template based on the actually obtained beam intensity distribution and the correlational method. Alternatively, it is possible to perform a beam adjustment and the like with respect to an edge position of the electron beam 12. FIG. 4B shows a two-dimensional intensity distribution of a reflected electron signal. The abscissa axis represents beam scanning positions. The ordinate axis represents reflected electron signal amounts.

However, the use of the above-mentioned signal processing method creates the following problem. Compared to the ordinary VSB, it takes a long time to find a two-dimensional beam intensity distribution using the surface scanning. Further, when the focus position is displaced for dozens of micrometers, not only the focus, but also a beam position or a beam rotation is affected. Consequently, the beam adjustment requires a lot of additional works.

To solve these problems, a method is designed to form a pattern having the same shape as the electron beam shape on the sample surface and to detect marks and adjust beams using this pattern. This method is examined with respect to an electron beam exposure apparatus for the scanning exposure system.

FIGS. 5A and 5B illustrate this beam adjustment method. As shown in FIG. 5A, the electron beam 12 is scanned in the direction of an arrow with reference to a CP alignment mark 121 formed on the sample surface. Then an operation is performed to find an intensity distribution for reflected electron signals before and after the electron beam 12 passes the CP alignment mark 121. The electron beam 12 is irradiated to a shaded region which is same as a pattern shape of the CP alignment mark 121. As shown in FIG. 5B, a resulting reflected electron signal becomes maximum when the CP alignment mark 121 completely coincides with the electron beam 12. Applying this beam adjustment method to beam adjustment, say, for CP exposure eliminates at least the need for the surface scanning and accompanying image processing and the like, making the beam adjustment simple.

However, when there are more than 100 types of CP apertures, for example, the beam adjustment for CP exposure would consume a vast amount of time in view of different numerical apertures or CP areas.

The following describes problems in the scanning exposure system.

FIG. 6A is a schematic diagram of the scanning exposure system. The scanning exposure system exposes the electron beam 12 irradiated from the electron gun 11 on the wafer 19 via the first aperture 13. This is same as the CP exposure system. The scanning exposure system provides a transfer mask 131 as shown in FIG. 6B instead of a second aperture 101. This transfer mask 131 differs from the second aperture 101 used for the CP exposure system. Regardless of availability of a repetitive pattern and the like, the transfer mask 131 has a pattern which is to be transferred to the wafer 19 and is exactly represented as exposure blocks 132a through 132f.

A pattern formed on this transfer mask 131 is divided into exposure blocks 132a through 132f with a specified size. The electron beam 12 is vertically deflected on a pattern provided in each of exposure blocks 132a through 132f. At the same time, the transfer mask 131 is displaced parallel. Patterns in exposure blocks 132a through 132f are reduced and transferred onto the wafer 19.

However, this scanning exposure system creates the following problems. As shown in FIG. 6B, different pattern densities are used such as for exposure regions 132f-1 and 132f-2 even within the same exposure block 132f. In this case, different current densities are found in the electron beam 12 traveling from the transfer mask 131 to the wafer 19. Consequently, defocusing occurs in accordance with pattern densities in exposure regions 132f-1 and 132f-2. FIG. 6C shows transfer patterns for exposure regions 132f-1 and 132f-2. A dimensional difference occurs between transfer patterns 133-1 and 133-2 which correspond to the respective regions. In addition, there is a problem that different pattern densities cause misalignment in drawing positions for transfer patterns 133-1 and 133-2.

However, the transfer mask and the exposure method according to the prior art have not taken effective measures for avoiding these problems.

The beam adjustment method for the conventional electron beam exposure has problems as follows. For example, many labors are needed for optimizing the focus position, the beam position and the like. Alternatively, a long time is required for calculating the two-dimensional beam intensity distribution based on the sample surface.

BRIEF SUMMARY OF THE INVENTION

It is an object of the present invention to provide a charge beam exposure apparatus capable of a precise, fast beam adjustment.

It is another object of the present invention to provide a charge beam exposure method capable of a precise, fast beam adjustment.

It is yet another object of the present invention to provide a charge beam exposure mask capable of a precise, fast beam adjustment.

According to a major aspect of the present invention, the present invention provides a charge beam exposure apparatus, comprising: a mask having a plurality of patterns with different pattern densities, a stage provided with a substrate to which patterns are transferred, and a controller. The controller has a drawing parameter table. This table stores optimal beam adjustment parameters using pattern densities as parameters for charge beams. Based on the drawing parameter table, the controller controls charge beams irradiated on the substrate. There is provided a charge beam exposure apparatus characterized in that a pattern transfer is performed by selecting an optimum beam adjustment parameter corresponding to the pattern density from the drawing parameter table for each of the above-mentioned patterns.

According to another aspect of the present invention, there is provided a charge beam exposure method for adjusting beams on a mask provided with a plurality of patterns having at least two pattern densities for each of these patterns and irradiates a charge beam to transfer the pattern on the sample surface. A pattern having different pattern densities is transferred to a sample surface to form a plurality of beam adjustment marks. Alternatively, these marks are formed with almost the same shape as the pattern which is already transferred to the sample surface. There is provided a charge beam exposure method characterized by having a first process, a second process, and a third process. The first process is used for irradiating a charge beam onto a plurality of beam adjustment marks, varying beam adjustment parameters for each pattern corresponding to the beam adjustment mark, detecting an electron reflected on the sample surface, and finding an optimum beam adjustment parameter. The second process is used for creating a drawing parameter table which stores optimum beam adjustment parameters using pattern densities as parameters. The third process is used for selecting an optimum beam adjustment parameter based on the drawing parameter table and for transferring a pattern onto the sample surface.

The present invention previously finds a beam adjustment parameter optimal for a pattern density. Further, the present invention creates a drawing parameter table based on this beam adjustment parameter and exposes a pattern. During exposure, an optimal beam adjustment parameter for the pattern density is selected from the drawing parameter table. It is possible to provide precision patterning by decreasing dimensional differences due to pattern density differences, drawing position fluctuations, and the like.

It is needless to find beam adjustment parameters for all pattern exposure openings. A beam adjustment is available by finding beam adjustment parameters only for representative points according to pattern densities. It is possible to provide an easy, fast beam adjustment.

Since a beam adjustment pattern is formed on a substrate, it is possible to create a beam adjustment mark by means of exposure using an ordinary Variable Shaped Beam. Further, just replacing a substrate provides easy maintenance when the beam adjustment mark is contaminated. Since the substrate is replaceable, the beam adjustment mark can be easily changed when a different pattern is used after replacement of a mask, for example.

According to another aspect of the present invention, the present invention provides a charge beam exposure mask which is provided for adjusting irradiation conditions of charge beams used for exposure. The charge beam exposure mask comprises a plurality of beam adjustment openings with different pattern densities and a plurality of pattern exposure openings used for pattern exposure.

Preferably, at least one of the beam adjustment openings is placed among a plurality of pattern exposure openings. Also preferably, a plurality of pattern exposure openings constitutes at least two pattern exposure opening groups comprising at least two pattern exposure openings as mentioned above. The beam adjustment opening is placed among a plurality of pattern exposure opening groups as mentioned above. Alternatively, the beam adjustment opening is placed nearer to a center of the mask than to a plurality of pattern exposure opening groups as mentioned above.

This mask structure shortens a distance for the mask to move during beam adjustment. Accordingly, the beam adjustment finishes in a short time and improves productivity for the charge beam exposure.

According to yet another aspect of the present invention, the present invention provides a charge beam exposure method which applies a beam adjustment to a mask provided with a plurality of patterns having at least two pattern densities for each of the corresponding patterns and irradiates a charge beam to transfer the pattern onto the sample surface. There is provided the charge beam exposure method which monitors a contamination situation of the mask based on the amount of electrons passing the mast pattern.

Accordingly, it is possible to determine proper timing to replace or clean the mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail, with reference to the accompanying drawings.

(First Embodiment)

Figure 7:
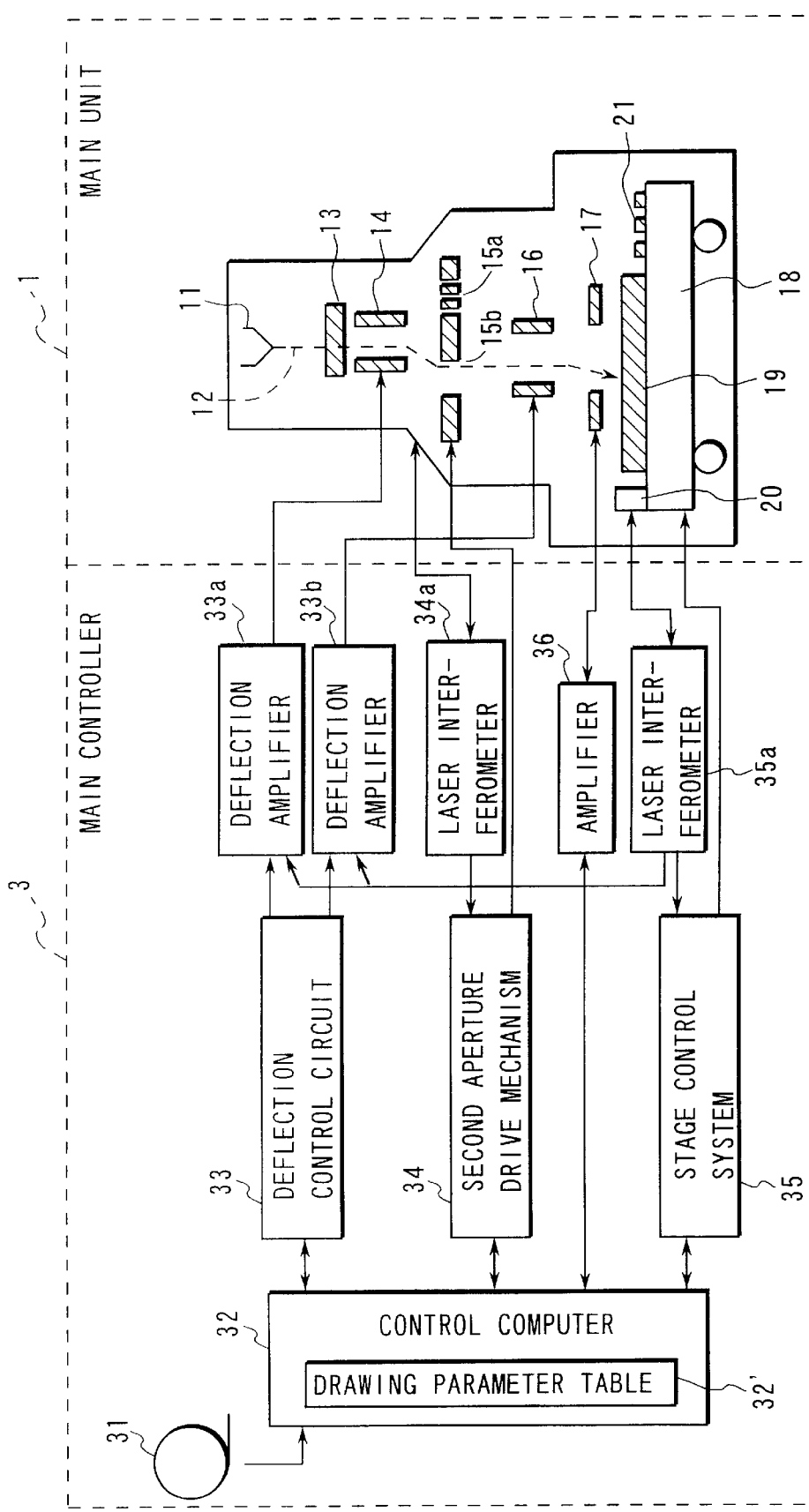
FIG. 7 shows an general structure of an electron beam exposure apparatus according to a first embodiment of the present invention.

FIG. 7 shows an general structure of an electron beam exposure apparatus according to the first embodiment of the present invention. This exposure apparatus is a CP (Character Projection) and variable shaped electron beam exposure apparatus with an acceleration voltage of 50 kV. The following explains a function of each component of this exposure apparatus.

The exposure apparatus according to this embodiment is roughly divided into a main unit 1 and a main unit controller 3. An electron gun 11 is provided on the main unit 1. Disposed on the traveling path of the electron beam 12 irradiated from the electron gun 11 are a first aperture 13, a deflector 14, a second aperture 15, a deflector 16, a detector 17, and a stage 18 in the name order along the traveling direction of the electron beam 12.

The first aperture 13 transforms the electron beam 12 irradiated from the electron gun 11 into a desired shape. The deflector 14 deflects the electron beam 12 passing through the first aperture 13 and irradiates it to a given position of the second aperture 15. The second aperture 15 is provided with a beam adjustment opening group 15a and a pattern exposure opening group 15b. The deflector 16 deflects the electron beam 12 passing through the second aperture 15 and irradiates it to a given position of a wafer 19. The wafer is placed on the stage 18.

A lens unit (not shown) is provided between the second aperture 15 and the stage 18. A pattern image obtained through the second aperture 15 is reduced in this lens unit and is transferred onto the wafer 19. Though not shown in FIG. 7, a beam illumination lens is provided above the first aperture 13. Above the second aperture 15, there is provided a lens for forming an image from the first aperture 13.

This apparatus uses a pattern reduction rate of 1/10 and a maximum beam size of 10 micrometers. Accordingly, the first aperture 13 is sized 100 by 100 micrometers square. A deflection width of the electron beam 12 is 2 mm in both X and Y directions. Accordingly, an exposure more than 2 mm wide requires to move the stage 18.

A mirror 20 is disposed on the stage 18. A position of the stage 18 is always measured by the mirror 20 and a laser interferometer 35a. A beam adjustment mark group 21 is disposed on the stage 18 whose shape corresponds to the beam adjustment opening group 15a. During beam adjustment, the electron beam 12 is irradiated onto the beam adjustment mark group 21. Then, the detector 17 disposed above the wafer 19 detects an electron reflected on the beam adjustment mark group 21.

The following describes a structure of the main unit controller 3. Exposure data 31 is input to a control computer 32. The exposure data 31 includes chip data to be exposed, mark positions in a chip, chip arrangement information on the wafer, chip positions used for a global alignment, corresponding mark information, and the like.

The control computer 32 is connected to a control system which operates the main unit 1. A detected signal from the detector 17 is input to the control computer 32. The control system operating the main unit 1 comprises a deflection control circuit 33, a second aperture drive mechanism 34, and a stage control unit 35.

The deflection control circuit 33 controls deflection of the electron beam 12. Deflection amplifiers 33a and 33b are connected to the deflection control circuit 33. The deflection amplifiers 33a and 33b respectively control the deflectors 14 and 16 by amplifying a deflection signal from the deflection control circuit 33.

A second aperture drive mechanism 34 drives the second aperture 15 based on the exposure data 31. A laser interferometer 34a is connected to the second aperture drive mechanism 34. The laser interferometer 34a always measures a position of the second aperture 15.

The second aperture drive mechanism 34 comprises a fine adjustment drive mechanism and a rough adjustment drive mechanism. The drive mechanism 34 accurately aligns the second aperture 15 based on positional information as feedback from the laser interferometer 34a. The second aperture drive mechanism 34 and the deflector 14 select patterns on the second aperture 15.

A laser interferometer 35a is connected to the stage control unit 35. The mirror on the stage 18 reflects the laser beam irradiating from the laser interferometer 35a. The laser interferometer 35a senses the reflected laser beam, thereby to measure the position of the stage 18. The stage 18 moves according to measured values. Feeding back positions of the stage 18 precisely aligns the position of the stage 18. A measurement value indicating the stage position which is generated in the laser interferometer 35a is also fed back to the deflection amplifier 33a. The measurement value is used for correcting a drawing position for the electron beam 12.

The control computer 32 is connected to the detector 17 via an amplifier 36. The detector 17 detects an electron reflected on a surface of the wafer 19 or the stage 18 (referred to hereafter as a sample surface). The detected signal is amplified by the amplifier 36 and is input to the control computer 32. Based on the detected signal from the detector 17, the control computer 32 controls main unit 1. Further, the control computer 32 comprises a drawing parameter table 32' to be described later.

Figure 8:
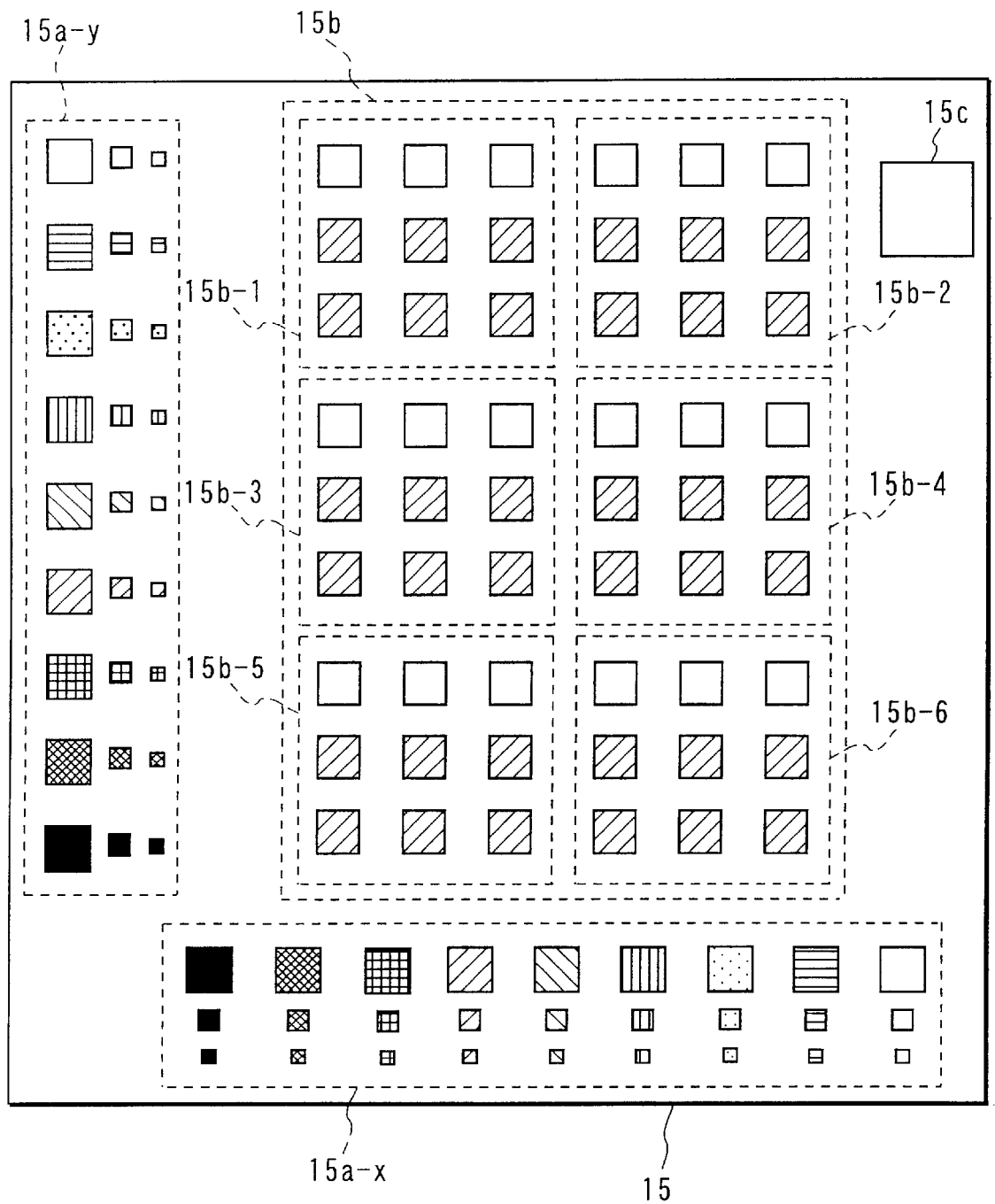
FIG. 8 is a top view showing in detail a second aperture according to the first embodiment.

The following describes in detail a sample structure of the second aperture 15 with reference to the top view in FIG. 8.

A beam adjustment opening group 15a, a pattern exposure opening group 15b comprised of 54 various patterns, and a rectangular aperture 15c are disposed on the second aperture 15.

The pattern exposure opening group 15b has the same structure and the same function as CP apertures used for an ordinary CP exposure system. As indicated with dotted lines, the pattern exposure opening group 15b is divided into six groups 15b-1 through 15b-6 for each exposure region, for example. Each of groups 15b-1 through 15b-6 contains a plurality of CP apertures (nine apertures in this figure).

The beam adjustment opening group 15a is further divided into two groups 15a-x and 15a-y according to differences in pattern barycenters. Beam adjustment openings in each group use different pattern densities and collective exposure regions. A plurality of beam adjustment openings is composed of an opening and a shading portion. More specifically, line and space pattern is formed at an interval of 20 micrometers on the aperture. An operation is performed to change Proportions of the opening and the shading portion in beam adjustment openings are varied, thereby to vary pattern densities for each beam adjustment opening in the range of 5% to 100%.

The second aperture 15 is formed on an SOI substrate 800 micrometers thick. An opening is formed by performing anisotropic etching through the use of a KOH solution from the rear side. A desired patterns are formed within an area 100 by 100 micrometers square at an SOI portion on the substrate surface. The patterns are plasma etched to form an openings.

Figure 9A:
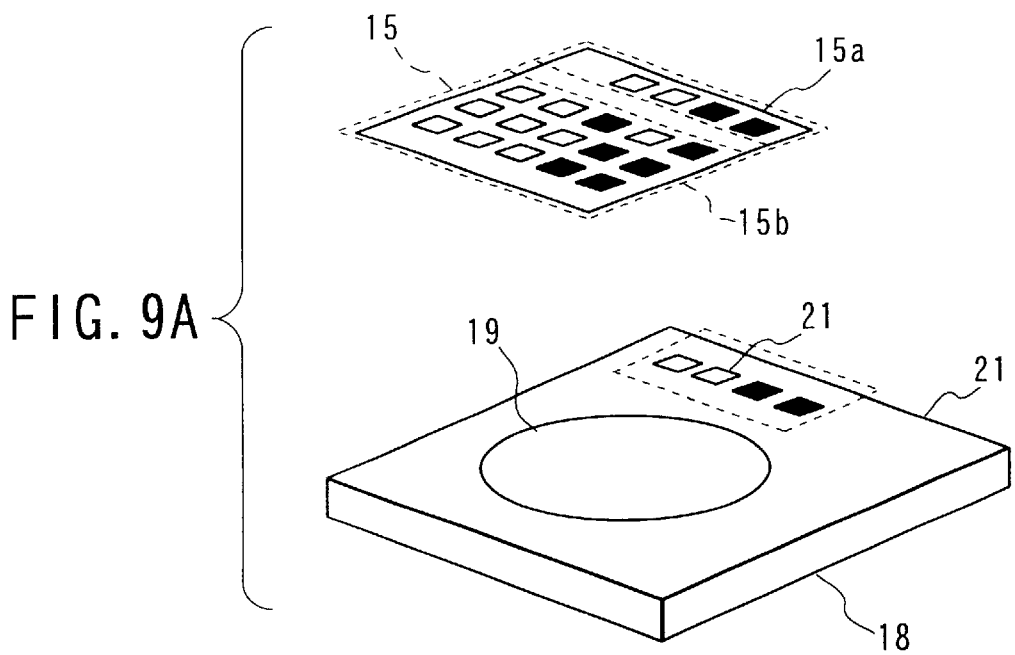
FIGS. 9A through 9C are perspective views showing structures of a stage and beam adjustment openings according to the first embodiment.
Figure 9B:
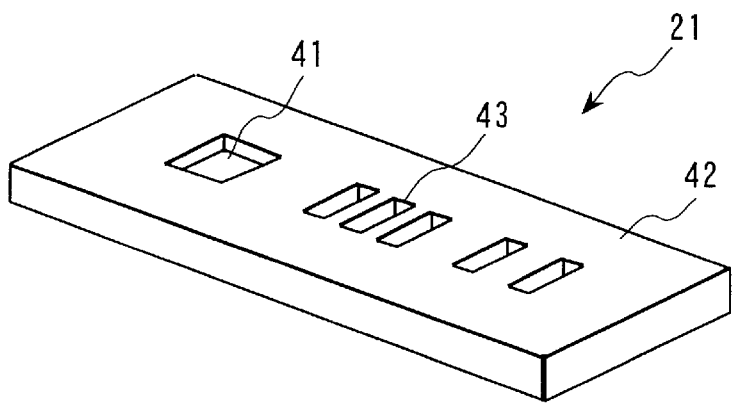
Figure 9C:
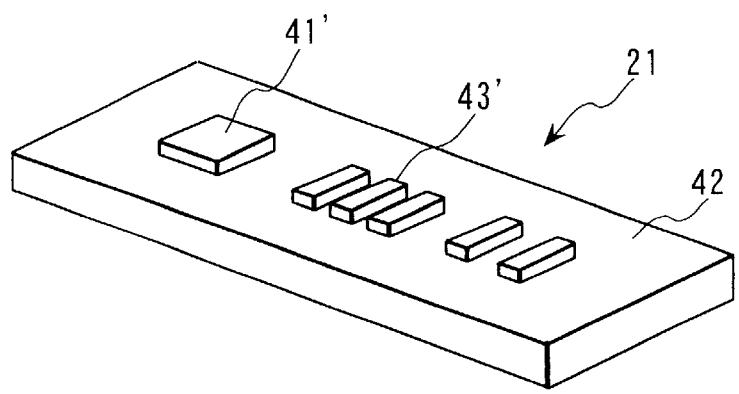

The following describes a detailed structure of the beam adjustment mark group 21 provided on the stage 18 with reference to perspective views in FIGS. 9A through 9C.

As shown in FIG. 9A, the beam adjustment mark group 21 is formed near the wafer 19 on the stage 18. As shown in FIG. 7, the second aperture 15 is disposed above the beam adjustment mark group 21. The beam adjustment opening group 15a formed on the second aperture 15 and the beam adjustment mark group 21 are similar in shape.

FIG. 9B shows an enlarged view of the portion of the beam adjustment mark group 21. As shown in FIG. 9B, a beam adjustment mark 41 constituting the beam adjustment mark group 21 is fabricated by forming a groove 43 with a depth of 300 nm on an Si substrate 42. FIG. 9C shows a modification of the beam adjustment mark group 21. As shown in FIG. 9C, a beam adjustment mark 41, is fabricated by forming a protruded heavy metal mark 43, on the Si substrate 42.

The following describes an electron beam exposure method according to this embodiment. This electron beam exposure method is roughly divided into a beam adjustment process and a pattern exposure process.

Figure 10:
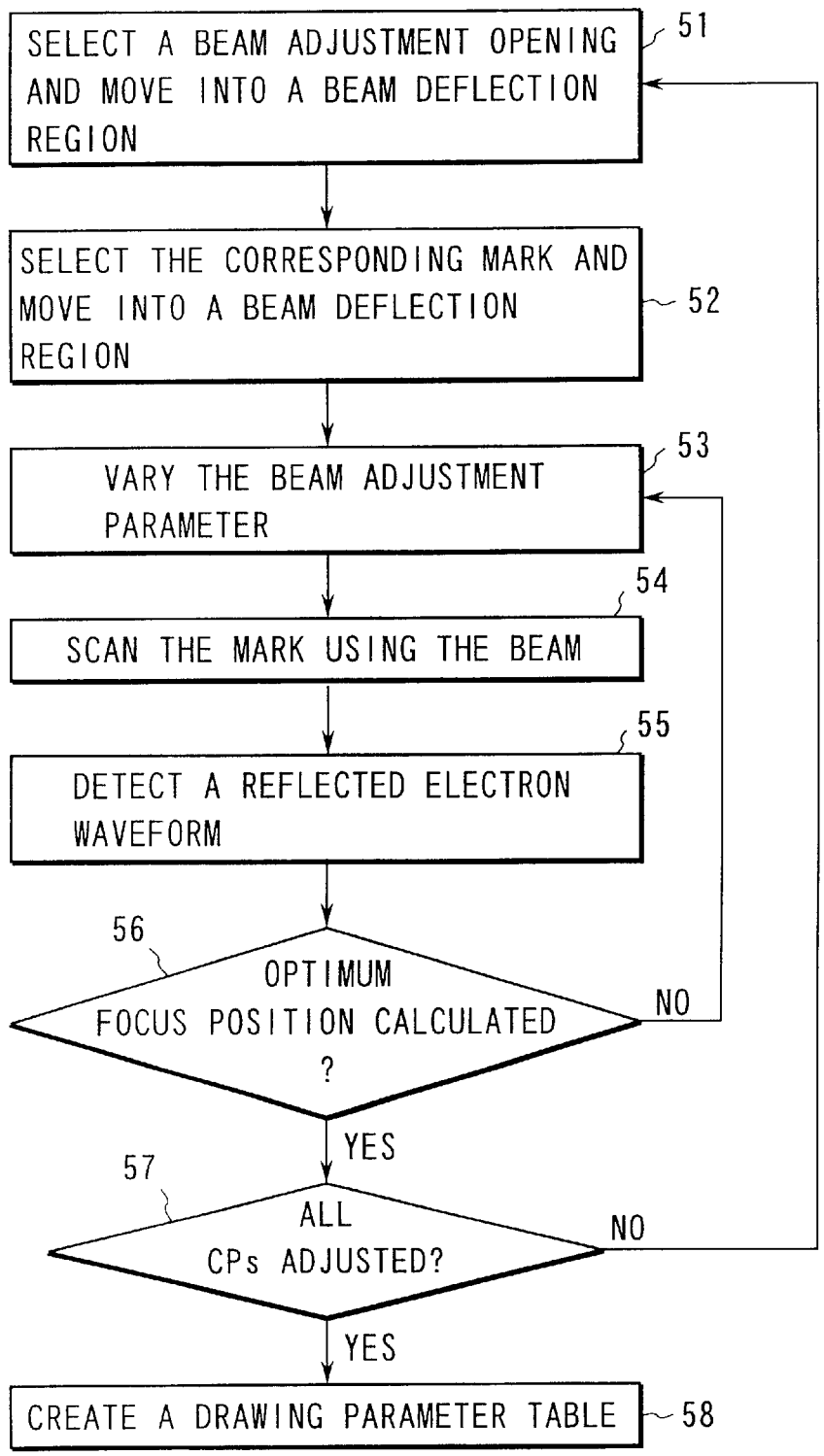
FIG. 10 shows a flowchart explaining a beam adjustment process according to the first embodiment.

FIG. 10 shows a flowchart explaining the beam adjustment process. This beam adjustment process uses the conventional method for adjusting variable shaped beams.

One beam adjustment opening is selected from the beam adjustment opening group 15a. The second aperture 15 is moved so that this beam adjustment opening is positioned in a deflection region for the electron beam 12 (51). Placement information about beam adjustment openings in the second aperture 15 is previously stored in a memory of the control computer 32(not shown). Accordingly, the second aperture drive mechanism 34 moves the second aperture 15 based on this placement information and the second aperture 15's position measured by the laser interferometer 34a.

Then, a beam adjustment mark 41 corresponding to the beam adjustment opening selected at (51) is selected from the beam adjustment mark group 21 formed on the stage 18. The stage 18 is moved so that the selected beam adjustment mark 41 is placed in a beam deflection region for the electron beam 12 (52). Placement information about the beam adjustment mark 41 is previously stored in a memory of the control computer 32 (not shown). Accordingly, the stage control unit 35 moves the stage 18 based on this placement information and the stage 18's position measured by the laser interferometer 35a.

Then, the electron gun 11 irradiates the electron beam 12. This electron beam 12 is formed through the first aperture 13, is deflected in the deflector 14, and is irradiated to the second aperture 15. The second aperture 15 is already moved to a given position at (51). Accordingly, the electron beam 12 passes through the selected beam adjustment opening and is irradiated onto the sample surface.

Figure 11A:
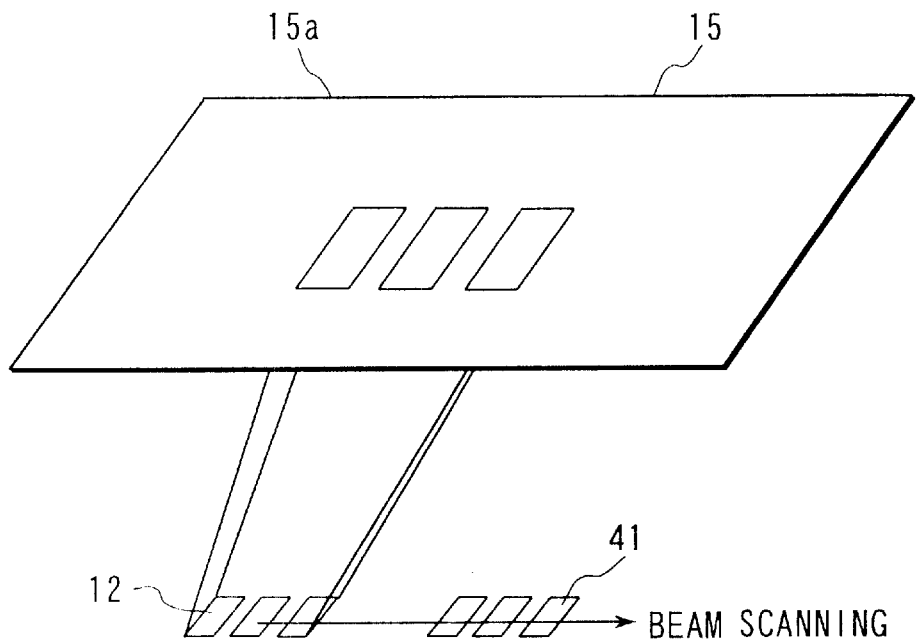
FIGS. 11A through 11C are schematic diagrams illustrating electron beam scanning according to the first embodiment.

FIG. 11A shows the relationship between the electron beam 12 and the beam adjustment mark 41. The structure except around the second aperture 15 and the sample surface is omitted in this figure for simplicity. As shown in FIG. 11A, a beam adjustment opening is a line and space pattern. Accordingly, the electron beam 12 having an image of a line and space pattern is irradiated onto the sample surface. Beam adjustment parameters for the electron beam 12 are set to specified values (53). Then, the electron beam 12 is used to scan the beam adjustment mark 41 selected at (52) in the X direction (54). A beam deflection system is used for beam scanning at an interval of 0.02 micrometers. This beam scanning allows the detector 17 to detect an electron reflected from the beam adjustment mark 41 (55).

Figure 11B:
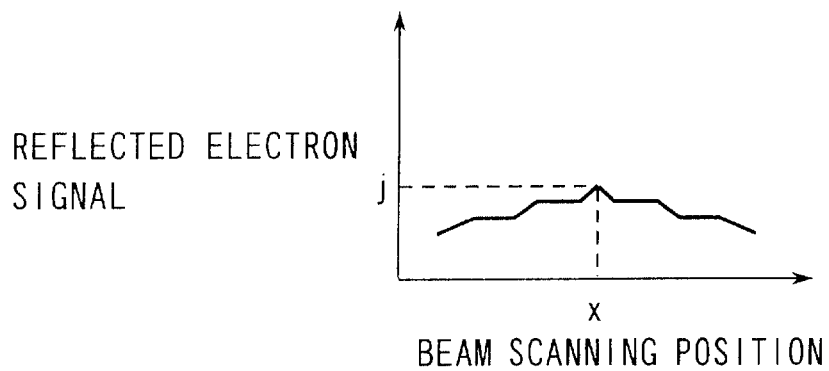

FIG. 11B shows a waveform for the resulting detected signal. The abscissa axis represents beam scanning positions. The ordinate axis represents reflected electron signal amounts. Scanning the beam adjustment mark 41 with the electron beam 12 generates most reflected electrons when the beam adjustment opening shape matches the shape of the beam adjustment mark 41. Accordingly, in FIG. 11B, a peak position x for the detected waveform corresponds to a position where the electron beam 12 matches the beam adjustment mark 41. By measuring this peak position x, it is possible to approximate the position of the beam adjustment mark 41 in the X direction. During this beam scanning, the control computer 32 stores the peak position x and a peak value j.

Further, the electron beam 12 is varied at a plurality of points in the Y direction for beam scanning and reflected electron detection according to steps (54) and (55). This operation also provides a detected signal waveform similar to that in FIG. 11B, namely a waveform with the peak value at a position where the beam adjustment opening matches the beam adjustment mark 41. The control computer 32 stores the peak position x, the y-direction position, and the peak value j.

Figure 11C:
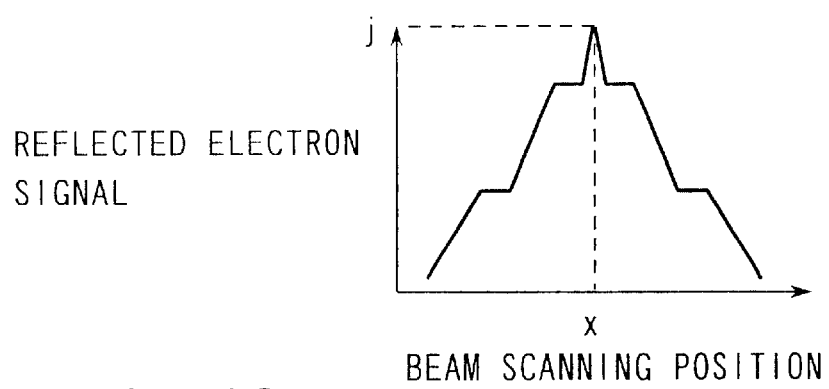

The above-mentioned steps (53) through (55) are repeated for a plurality of focus positions to find the peak position x, the y-direction position, and the peak value j for each focus position. Based on the detection result for each focus position, an excitation value of the objective lens is calculated (56). When the excitation value of the objective lens varies to be in focus, as shown in FIG. 11C, the resulting signal waveform contains higher peak values j than those in FIG. 11B. The optimum focus position is generated from a signal waveform with the largest peak value j. When the electron beam 12 is scanned in x and y directions, a position indicating the largest peak value corresponds to a pattern density, namely a beam position displacement amount depending on a beam current.

Figure 12:
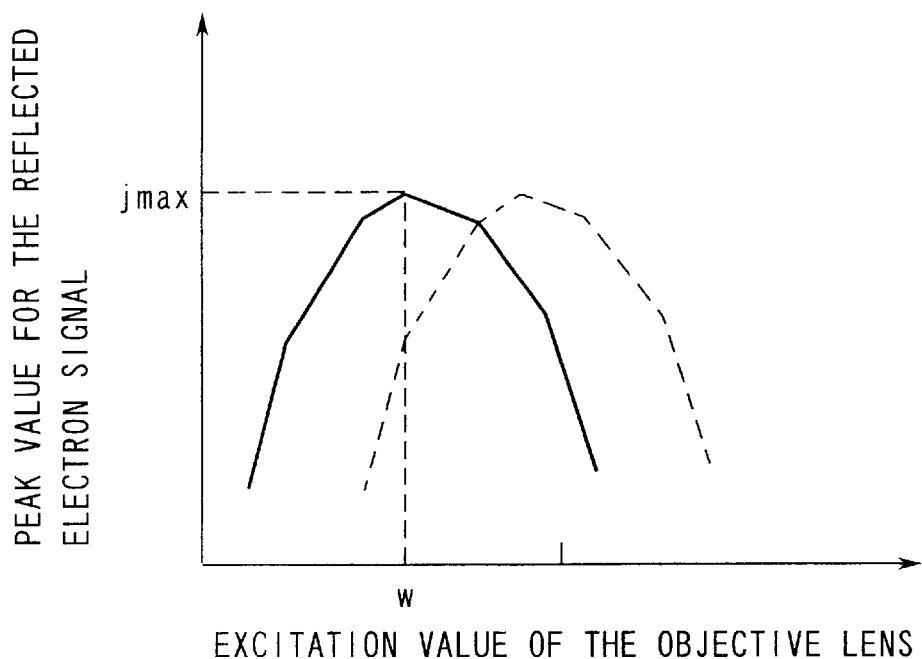
FIG. 12 shows the relationship between an excitation value of the objective lens and a peak value according to the first embodiment.

FIG. 12 shows the relationship between the excitation value of the objective lens and the peak value j. The abscissa axis represents excitation values of the objective lens w. The ordinate axis represents peak values j for the reflected electron signal. As indicated with a solid line in FIG. 12, the optimum focus position corresponds to excitation value of the objective lens w with the maximum peak value j (jmax). A plurality of relational curves and the like are obtained by diversely varying beam adjustment parameters such as beam positions in x and y directions, beam rotations, reduction, and the like. A relational curve with the largest peak value j is selected from a plurality of relational curves obtained.

A excitation value of the objective lens corresponding to the maximum peak value j (jmax) is assumed to be an optimum focus position. An operation is performed to find beam adjustment parameters for providing the optimum focus position and store these parameters in the control computer 32.

Similarly, steps (51) through (56) are performed to find beam adjustment parameters for an optimum focus position by further selecting different beam adjustment openings. After beam adjustment parameters are found with respect to all beam adjustment openings (57), the control computer 32 creates a drawing parameter table 32'.

Figure 13:
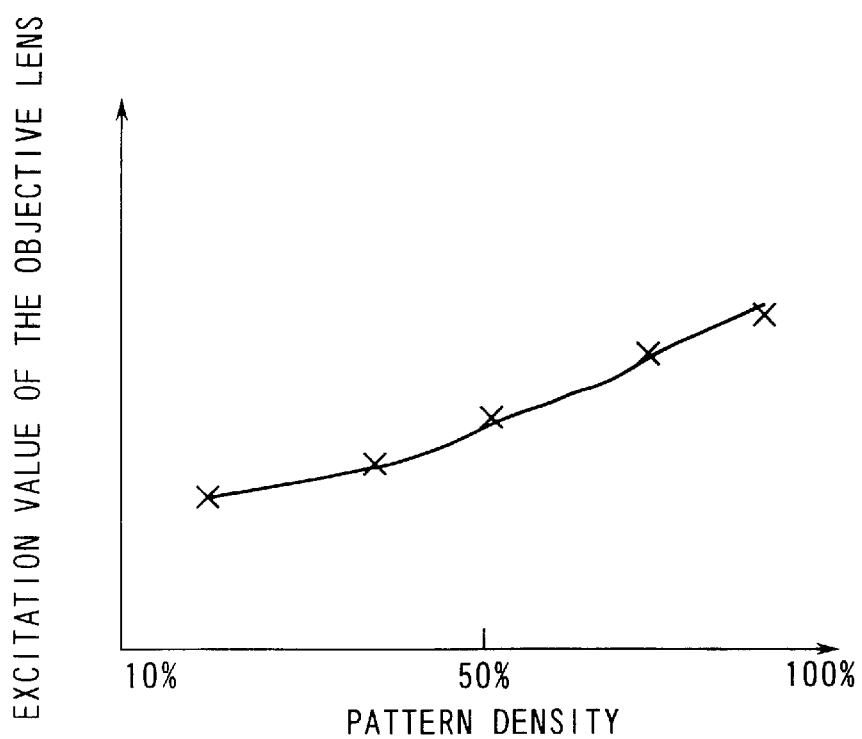
FIG. 13 shows an example of a drawing parameter table according to the first embodiment.

FIG. 13 shows an example of the drawing parameter table 32'. The abscissa axis represents pattern densities. The ordinate axis represents excitation values of the objective lens. As mentioned above, a plurality of beam adjustment openings are provided with different pattern densities, namely different numerical apertures for patterns. An operation is performed to plot excitation values of the objective lens with respect to a plurality of beam adjustment openings obtained and to perform a linear interpolation. This results in a relational line or curve as shown in FIG. 13. Similarly, the drawing parameter table 32' is created with respect to positional displacements (x, y) of beams corresponding to pattern densities.

The following describes a pattern exposure process.

First, the exposure data 31 is output from the control computer 32 to the deflection control circuit 33. A specified pattern exposure opening is selected from the pattern exposure opening group 15b. The selected pattern exposure opening has predetermined parameters corresponding to pattern densities such as positional information on the second aperture 15, exposure position information on the sample, and the like. Based on these parameters, an optimum drawing parameter is determined from the drawing parameter table 32' in FIG. 13 which is obtained in the beam adjustment process. A focus position is varied by varying excitation of the objective lens (not shown). Further, a pattern exposure is performed by correcting beam displacements through the use of the deflector 14 or 16.

As mentioned above, in this embodiment, beam adjustment parameters corresponding to the pattern density are previously found before pattern exposure. Further, a drawing parameter table is created from the beam adjustment parameters. A pattern exposure is performed on the basis of this drawing parameter table. Accordingly, when the pattern exposure is performed, an optimum beam adjustment parameters are selected in accordance with the pattern density, providing precision patterning. In addition, it is unnecessary to find beam adjustment parameters for all pattern exposure openings, providing an easy, fast beam adjustment.

Further, the beam adjustment according to this embodiment can irradiate the electron beam 12 so as to overlap the beam adjustment opening. Accordingly, no beam defocusing occurs when an electron beam at the beam edge is irradiated onto the wafer.

The present invention is not limited to the above-mentioned embodiment. Moreover, the present invention is not limited to the structure of the second aperture 15 in FIG. 8. There are no limitations on the number of beam adjustment openings or pattern exposure openings.

It should be noted that, in this embodiment, beam adjustment parameters are found with respect to all beam adjustment openings, and then the drawing parameter table 32' is created. However, it is also possible to find beam adjustment parameters with respect to only representative beam adjustment openings according to measurement conditions such as required exposure accuracy, measuring time, and the like.

(Second Embodiment)

This embodiment relates to a modification of the first embodiment, and more particularly, to a mode for creating a beam adjustment mark on the reference wafer in the first embodiment. Accordingly, only the structure of beam adjustment marks differs. The other structures are same as for the first embodiment. Detailed descriptions thereabout are omitted for simplicity.

Figure 14:
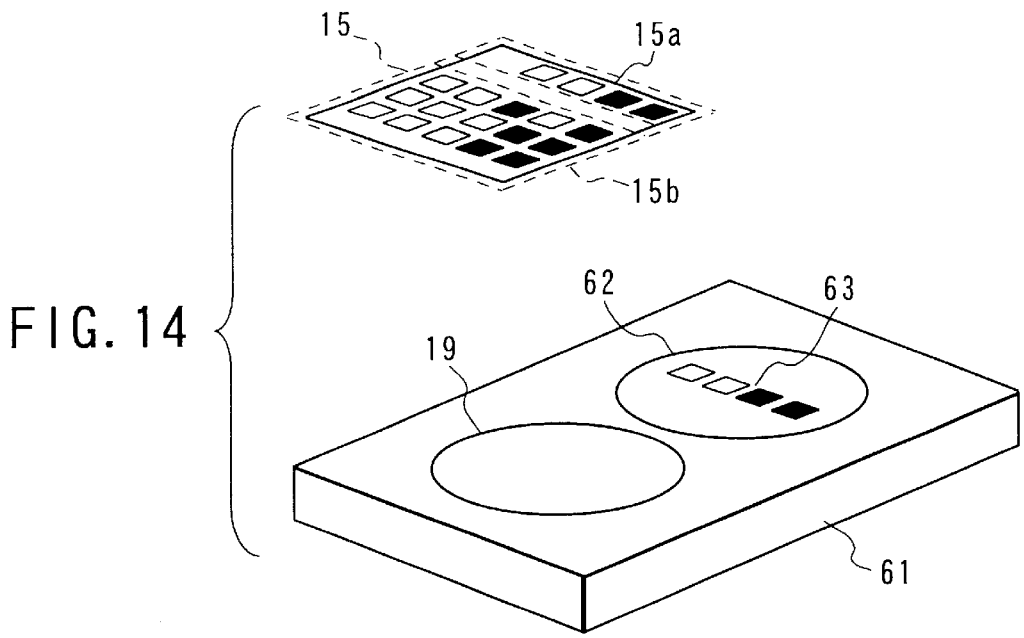
FIG. 14 is a schematic diagram illustrating an electron beam exposure method according to a second embodiment of the present invention.

FIG. 14 shows structures of the stage 61 and the second aperture 15 in an electron beam exposure apparatus according to this embodiment. The other. structures in the exposure apparatus are same as those in FIG. 7.

As shown in FIG. 14, the wafer 19 is placed on the stage 61 like in FIG. 7. A pattern is transferred to the wafer 19. A reference wafer 62 is placed near the wafer 19 on the stage 61. A plurality of beam adjustment marks 63 are formed on the reference wafer 62. The beam adjustment marks 63 and the beam adjustment marks 41 in FIG. 9A are similar in shape. The reference wafer 62 has a groove formed on the Si substrate. An Si oxide film is embedded in this groove. The beam adjustment marks 63 may be protruded heavy metal marks instead of grooved marks as shown in FIG. 9B.

Figure 15:
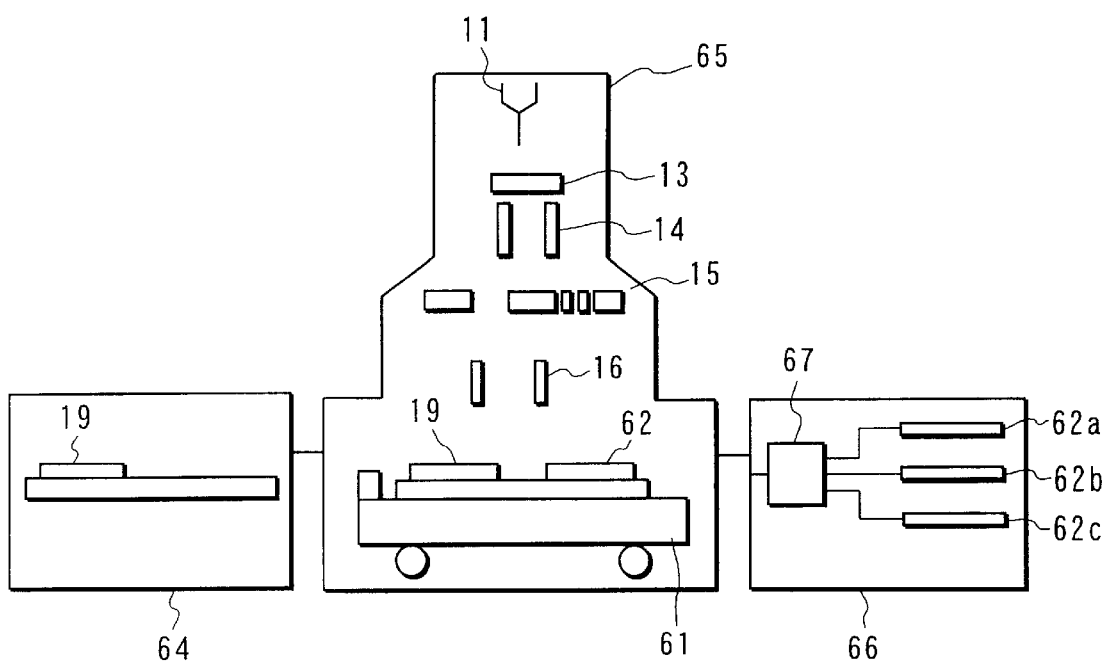
FIG. 15 illustrates a transportation system for a wafer 19 and a reference wafer 62 according to the second embodiment.

FIG. 15 illustrates a transportation system for the wafer 19 and the reference wafer 62. The wafer 19 is kept in the wafer holder 64 and is carried into an exposure chamber 65 each time a pattern exposure terminates. Also as shown in FIG. 15, the reference wafer 62 is kept in a reference wafer holder 66. In this example, three reference wafers 62a through 62c are kept in the reference wafer holder 66 according to a pattern shape of the second aperture 15. Selection and carriage means 67 is provided in the reference wafer holder 66. According to requirement, the selection and carriage means 67 selects one of reference wafers 62a through 62c as the reference wafer 62 and transports it into the exposure chamber 65.

Like the first embodiment, a beam adjustment and a pattern exposure are performed through the use of the beam adjustment mark 63 formed on the reference wafer 62. As a result, precision patterning is available similarly to the first embodiment.

This embodiment not only provides effects equivalent to the first embodiment, but also uses the beam adjustment marks 63 on the reference wafer 62 for beam adjustment without fixing beam adjustment marks on the stage 61. Accordingly, it is possible to easily create beam adjustment marks by means of exposure using an ordinary variable shaped electron beam. When the beam adjustment marks,63 are contaminated, it can be easily maintained just by replacing the reference wafer 62 through the use of the selection and carriage means 67. Moreover, since the selection and carriage means 67 can be used for replacing the reference wafer 62, it is possible to easily provide the beam adjustment marks 63 with a different shape even if a beam adjustment opening is differently shaped.

This embodiment uses an Si oxide film embedded in an Si groove for the beam adjustment marks 63 which is used as a beam adjustment target. The present invention is not limited to target structures. For example, a target may be provided with uneven steps. Furthermore, the target may be just an uneven step or may be a through-hole.

The above-mentioned first and second embodiments use the CP and variable shaped electron beam exposure apparatus with an acceleration voltage of 50 kV. However, the present invention is not limited to types of electron beam exposure apparatuses. For example, an electron beam exposure apparatus may comply with the CP system only or the scanning exposure system. Furthermore, an acceleration voltage of approximately 100 kV creates no problems. It is further understood by those skilled in the art that various changes and modifications may be made in the invention without departing from the spirit and scope thereof.

(Third Embodiment)

This embodiment relates to a modification of the second embodiment. The major difference between this embodiment and the second embodiment is that a beam adjustment is performed through the use of a pattern exposure opening itself without providing a beam adjustment opening on the second aperture 15. The following describes an electron beam exposure method according to this embodiment through the use of an electron beam exposure apparatus having almost the same structure as the second embodiment.

Figure 1:
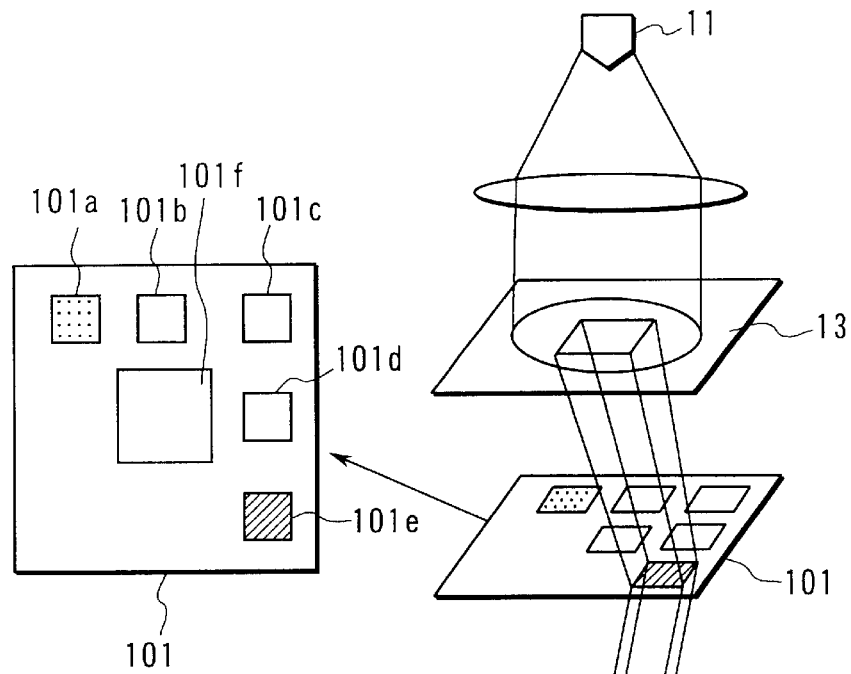
FIG. 1 is a schematic diagram of a character projection exposure system according to the prior art.
Figure 2:
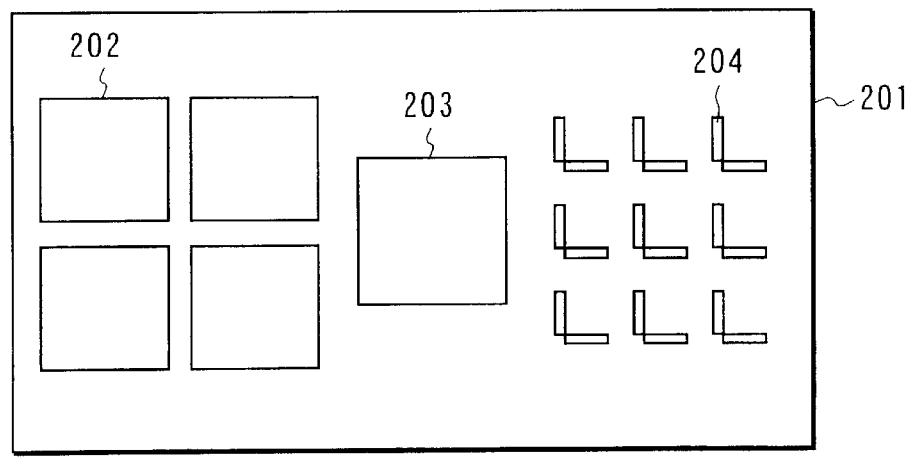
FIG. 2 illustrates a structure of a second aperture in a character projection exposure apparatus according to the prior art.
Figure 3A:
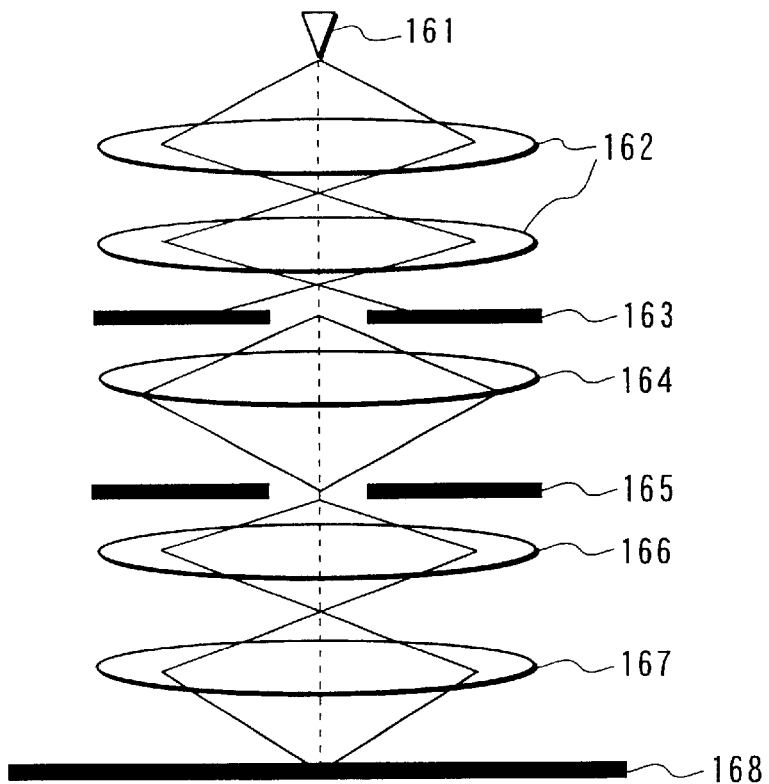
FIGS. 3A and 3B illustrates an electro-optic system for an exposure apparatus according to the prior art.
Figure 3B:
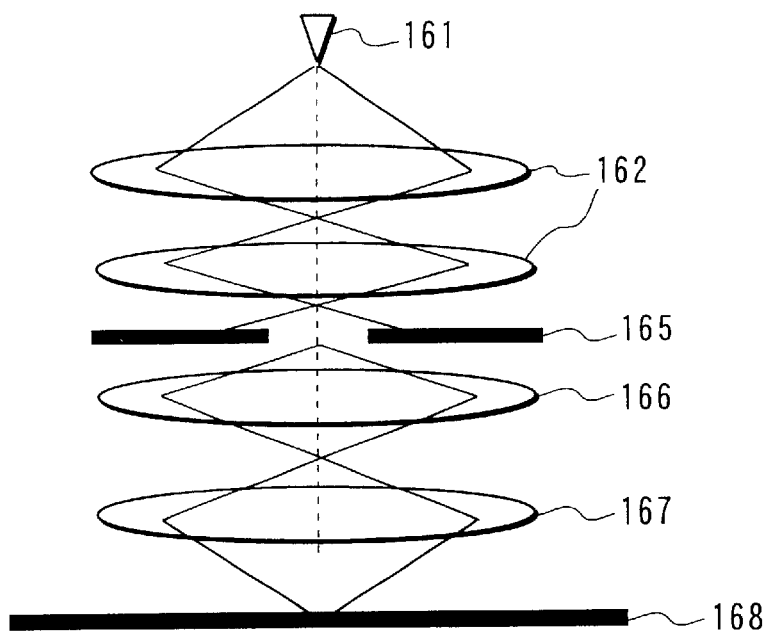
Figure 4A:
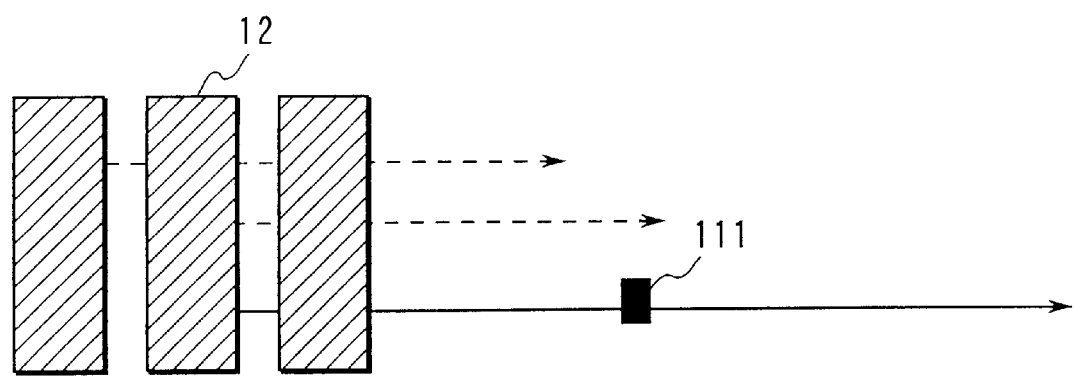
FIGS. 4A and 4B depict beam adjustment problems in the character projection exposure system according to the prior art.
Figure 4B:
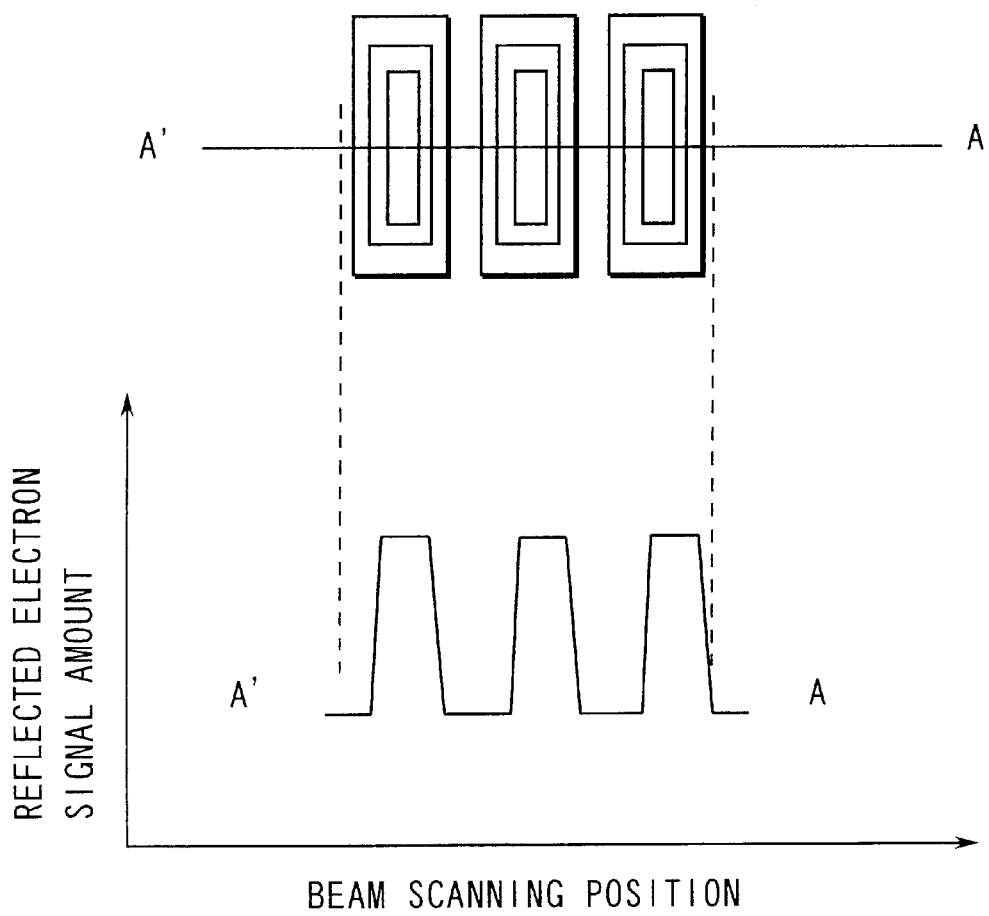
Figure 5A:
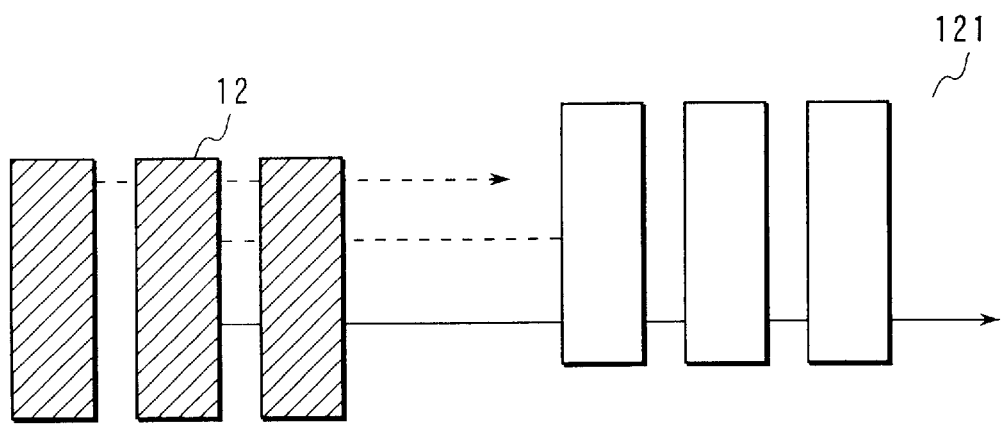
FIGS. 5A and 5B illustrate an improved beam adjustment method in the character projection exposure system according to the prior art.
Figure 5B:
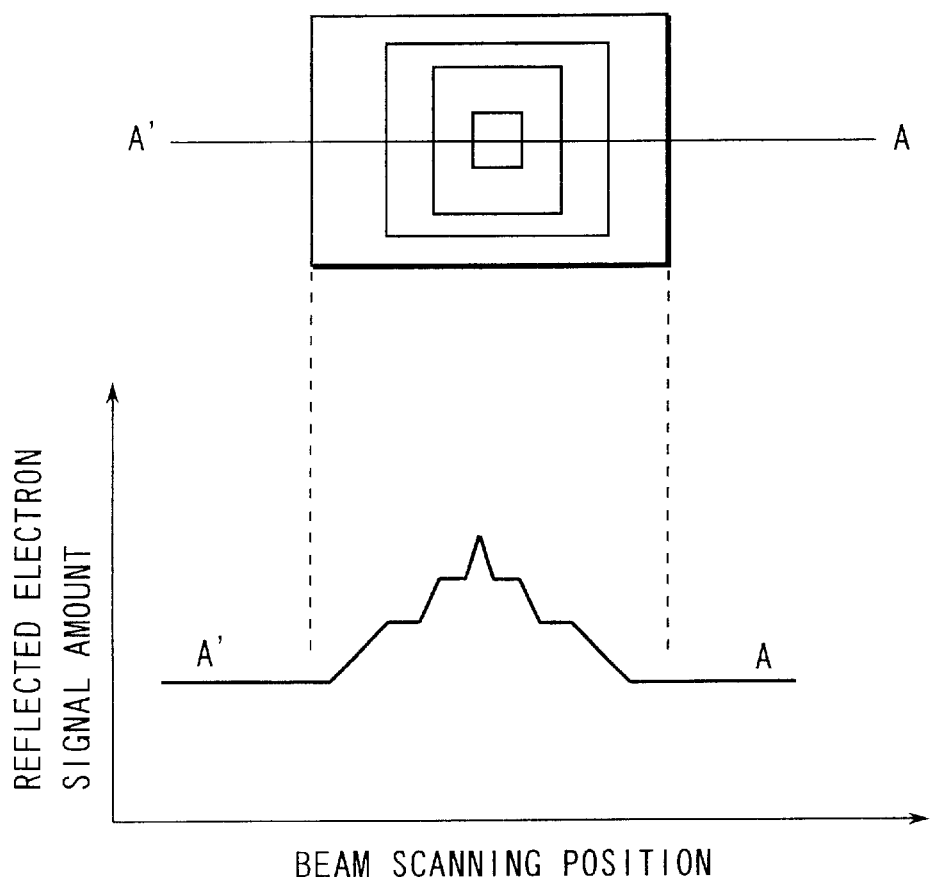
Figure 6A:
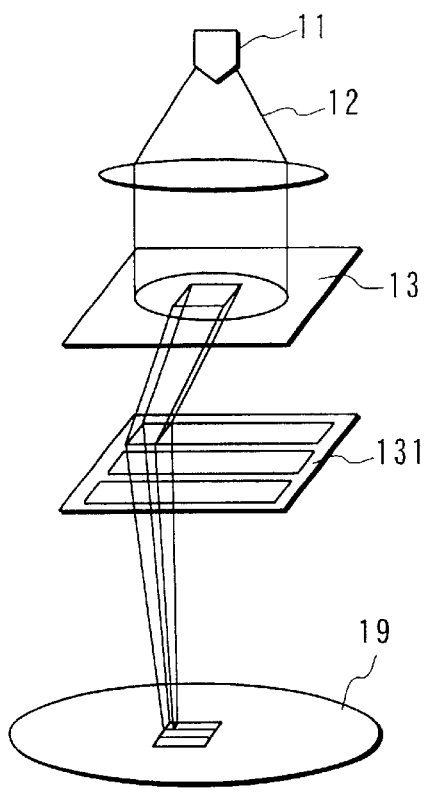
FIGS. 6A through 6C illustrate problems in a scanning exposure system according to the prior art.
Figure 6B:
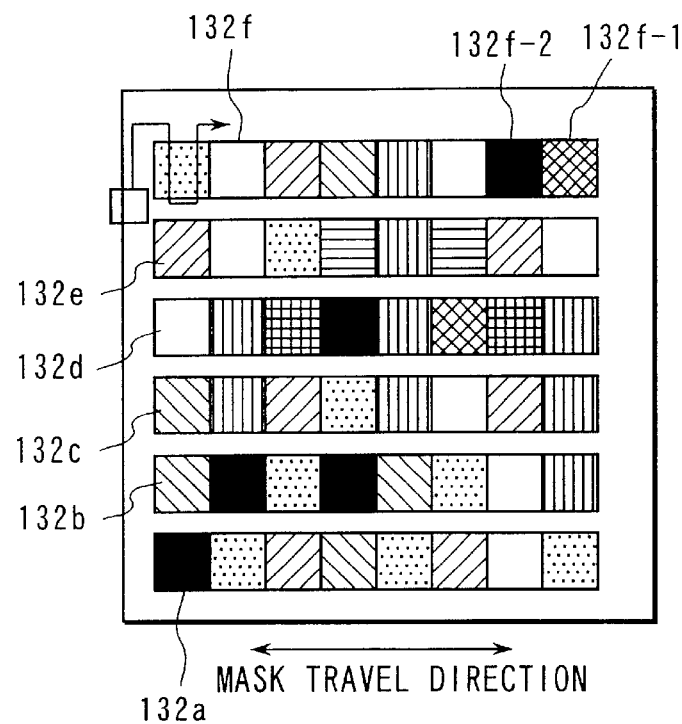
Figure 6C:
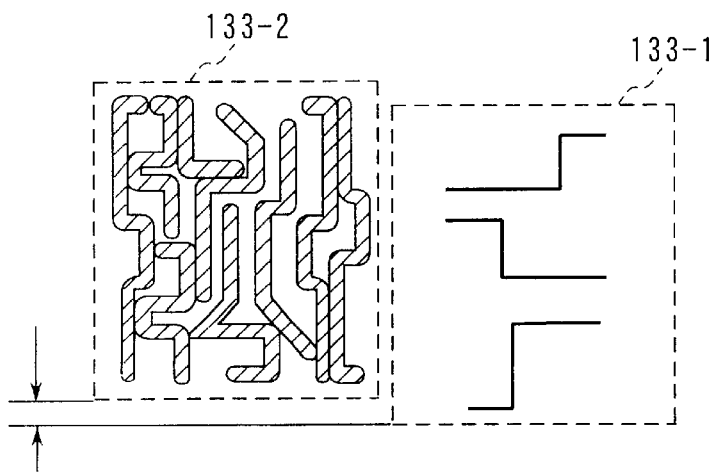
Figure 16:
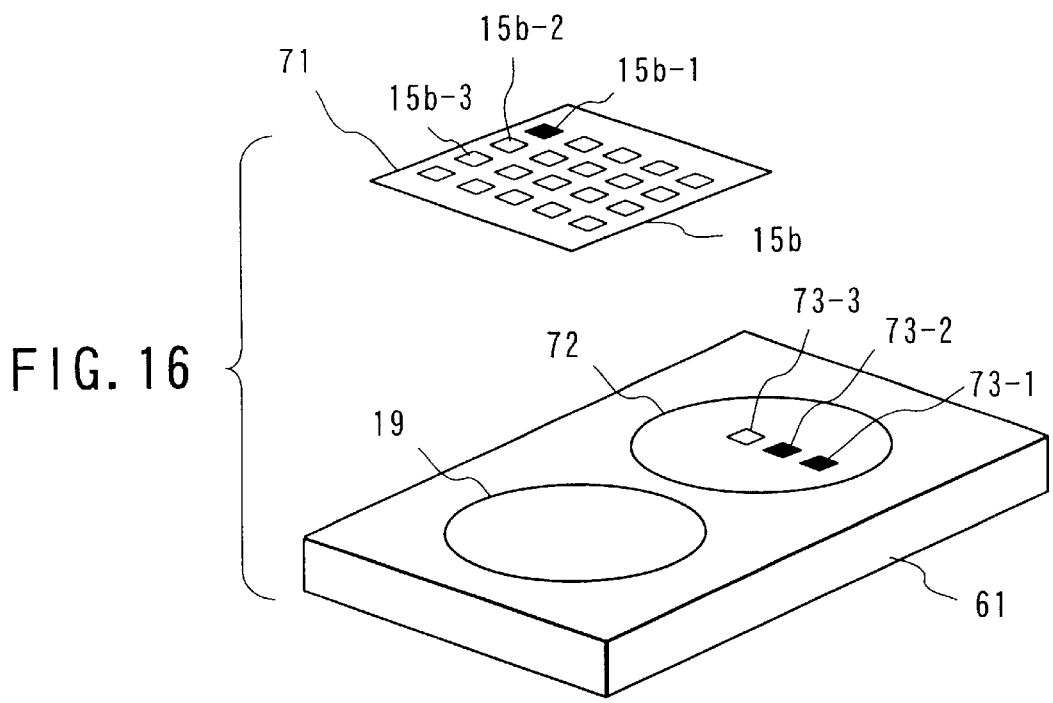
FIG. 16 is a schematic diagram explaining an electron beam exposure method according to a third embodiment of the present invention.

FIG. 16 shows structures of the stage 61 and a second aperture 71 in an electron beam exposure apparatus according to this embodiment. The other structures in the exposure apparatus are same as those in FIG. 1. As shown in FIG. 16, only the pattern exposure opening group 15b is formed on the second aperture 71. No beam adjustment openings are formed. The structure of the pattern exposure opening group 15b is same as that shown in FIG. 8.

The stage 61 is same as that shown in FIG. 14. In FIG. 16, a difference is that no pattern is formed on a reference wafer 72 before beam adjustment.

The following describes an electron beam exposure method according to this embodiment.

The second aperture 71 is fabricated according to the prior art. Pattern information on the second aperture 71 is previously stored in a memory of the control computer 32 (not shown). Based on this pattern information, a plurality of pattern exposure openings with different pattern densities are selected from the pattern exposure opening group 15b in the second aperture 71. As shown in FIG. 15, pattern exposure openings 15b-1 through 15b-3 are selected. For example, 15b-1, 15b-2, and 15b-3 are provided with pattern densities 10%, 30%, and 50% respectively.

Then, using the selected pattern exposure openings 15b-1 through 15b-3, beam adjustment marks 73-1 through 73-3 are formed on the reference wafer 72. These marks have the same shapes as the pattern exposure openings 15b-1 through 15b-3. Like the second embodiment, a variable shaped electron beam exposure apparatus is used for creating these beam adjustment marks 73-1 through 73-3. The mark structure may be a groove as adopted in the second embodiment or may be a heavy metal protrusion.

For clarity of explanation, this embodiment selects three pattern exposure openings for beam adjustment. Obviously, there are no limitations on the number of pattern exposure openings to be selected.

Then, the reference wafer 72 is carried and mounted on the exposure apparatus. Like the first embodiment, a beam adjustment is performed to create the drawing parameter table 32' corresponding to a pattern density.

During exposure, like the first embodiment, an optimum drawing parameter is specified from the drawing parameter table 32' corresponding to the selected pattern exposure opening. As a result, precision patterning is available.

This embodiment not only provides effects equivalent to the second embodiment, but also eliminates a beam adjustment opening group from the second aperture. The second aperture can have a simple structure.

(Fourth Embodiment)

Figure 17:
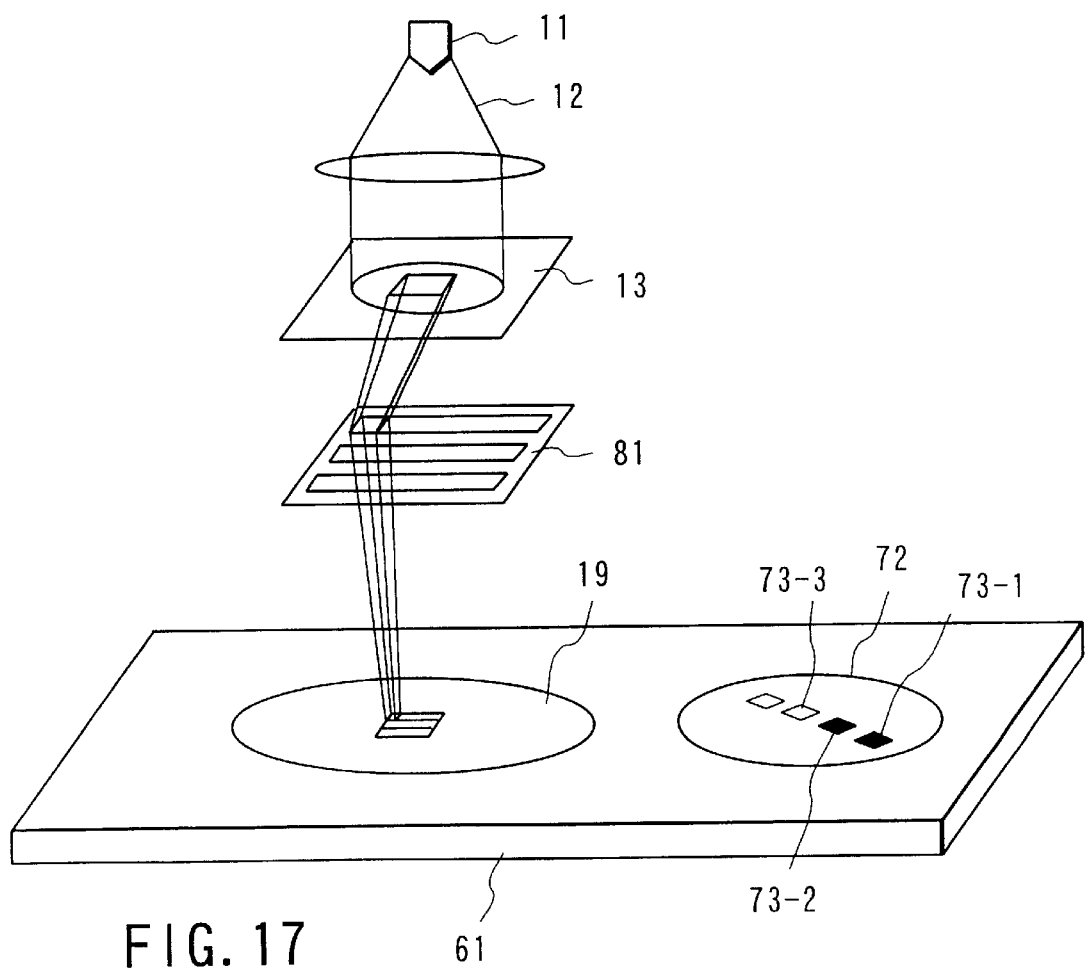
FIG. 17 shows part of an electron beam exposure apparatus according to a fourth embodiment of the present invention.

This embodiment shows an application of the present invention to a scanning exposure system. FIG. 17 shows part of an electron beam exposure apparatus according to this embodiment. Structures same as those in FIG. 7 are omitted from FIG. 17 for simplicity.

As shown in FIG. 17, disposed on the traveling path of the electron beam 12 irradiated from the electron gun 11 are the first aperture 13, a transfer mask 81, and the stage 61 in the name order along the traveling direction of the electron beam 12. Like the third embodiment, there are provided the wafer 19 to which a pattern is to be transferred and the reference wafer 72 on the stage 61. No pattern is formed on the reference wafer 72 before beam adjustment. This apparatus uses an acceleration voltage of 50 kv. The electron beam 12 as large as 100 by 100 micrometers square is formed on the first aperture 13.

Figure 18A:
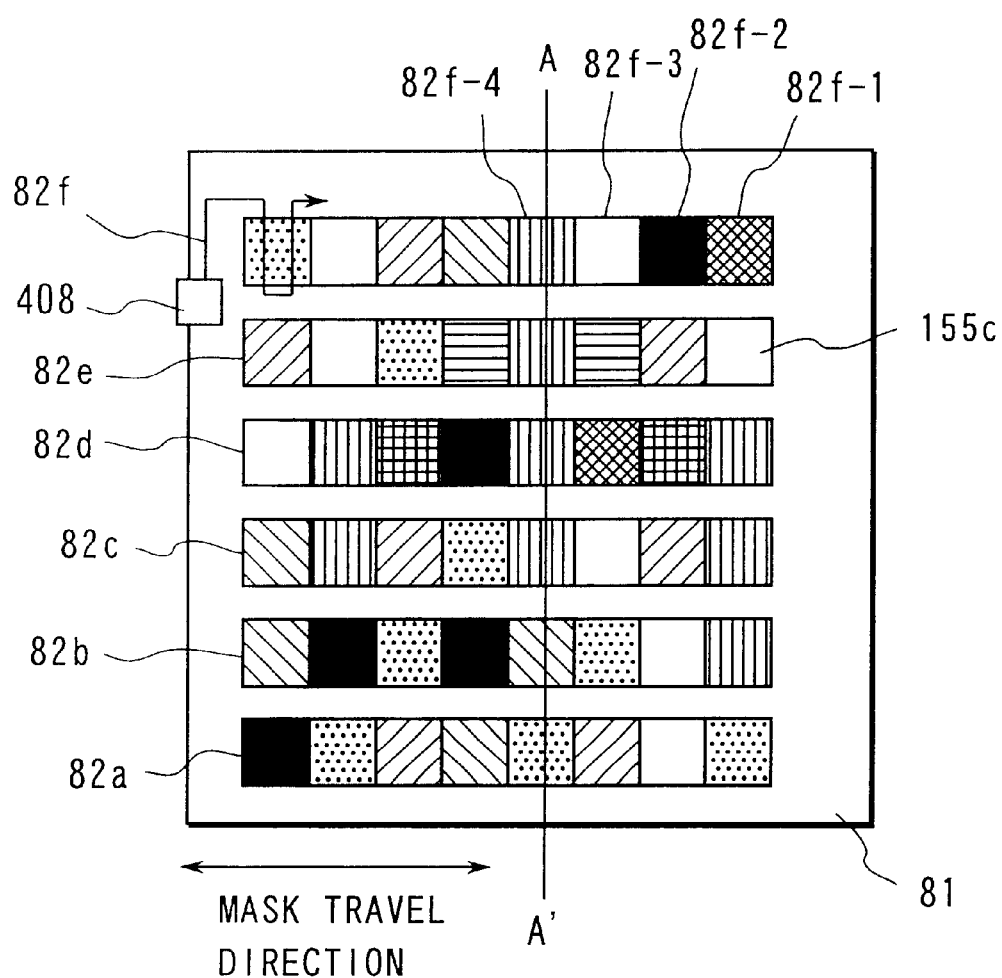
FIGS. 18A and 18B show in detail a structure of a transfer mask according to the fourth embodiment.

The following describes a detailed structure of the transfer mask 81 used for this embodiment with reference to the top view in FIG. 18A. A pattern formed on the transfer mask 81 is divided into exposure blocks 82a through 82f of desired sizes. Each of the exposure blocks 82a through 82f has a plurality of regions according to pattern densities. For example, an exposure block 82f is divided into eight regions 82f-1 through 82f-8. The exposure blocks 82a through 82f form an integral region to be scanned and transferred collectively. Each of regions 82f-1 through 82f-8 defines a region which can be exposed with same drawing parameter. That is to say, in each of regions 82f-1 through 82f-8, the exposure is made with different drawing parameter according to a pattern density difference.

Figure 18B:
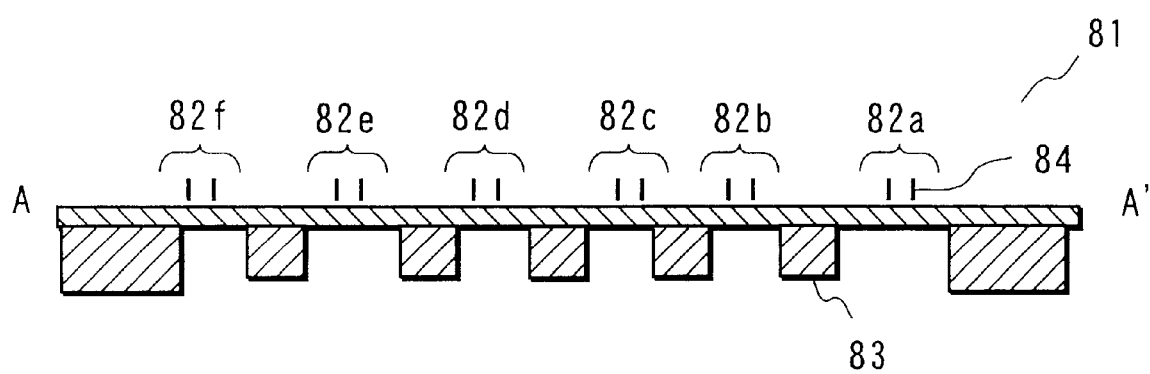

FIG. 18B shows a fragmentary cross sectional view of the transfer mask 81 taken along line A–A' of FIG. 18A. The transfer mask 81 is formed of an SOI wafer. Exposure blocks 82a through 82f are formed on the transfer mask 81. Each of these blocks is 100 micrometers wide. On the rear of the exposure blocks 82a through 82f, there is provided an opening by means of anisotropic etching using a KOH solution. An Si bridge 83 is formed between two of the exposure blocks 82a through 82f for increasing a mechanical strength. A desired pattern 84 to be exposed is formed on the exposure blocks 82a through 82f.

The following describes an electron beam exposure method according to this embodiment using the flowchart in FIG. 19A.

First, an operation is performed to create an area density map for the prepared transfer mask 81 (91). This density map contains a different area density for each region in exposure blocks 82a through 82f.

Then, a reference region on the transfer mask 81 is defined on the basis of the created area density map. In this example, regions 82f-1, 82f-2, and 82f-4 are defined as reference regions approximate to pattern densities, say, 10%, 30%, and 50%. Like the third embodiment, beam adjustment marks 73-1 through 73-3 whose shapes are similar to the regions 82f-1, 82f-2, and 82f-4 are formed on the reference wafer 72 based on the defined regions 82f-1, 82f-2, and 82f-4 (93).

Then, a beam adjustment is applied to the above-mentioned selected reference region in the same manner as described in the first to third embodiments by using the beam adjustment marks 73-1 through 73-3 formed with different pattern densities (94). The electron beam 12 is irradiated onto the reference wafer 72 to obtain a reflected electron signal. The reflected electron signal is processed to create the drawing parameter table 32' (95). Based on the created drawing parameter table 32', a pattern exposure is performed by adjusting beam adjustment parameters.

According to the above-mentioned steps, performing the pattern exposure results in more accurate pattering than the conventional scanning exposure system.

Figure 19:
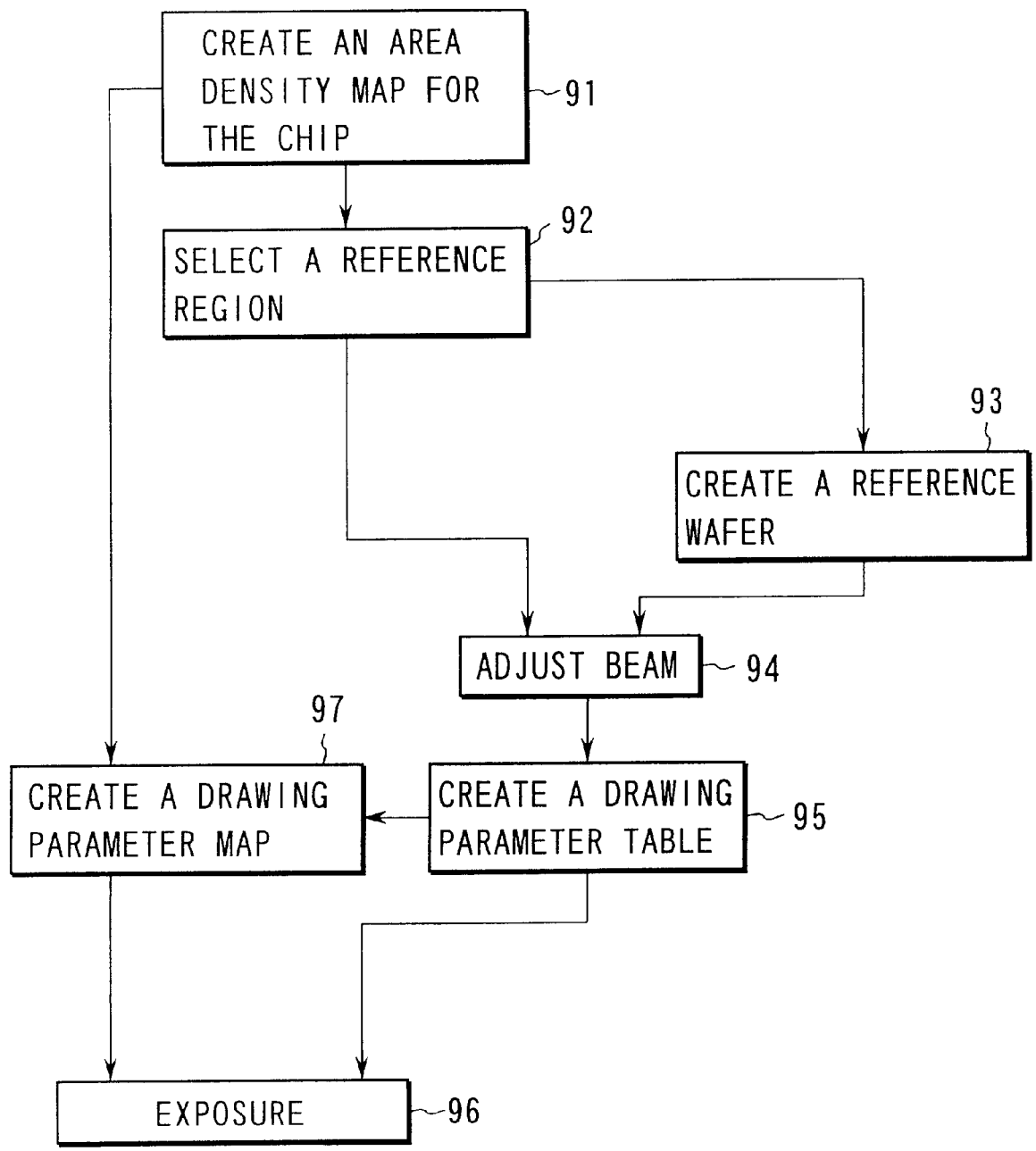
FIG. 19 shows a flowchart explaining an electron beam exposure method according to the fourth embodiment.

As shown in FIG. 19, it is also possible to create a drawing parameter map (97) which has a one-to-one correspondence with the area density map by using the drawing parameter table 32' and the area density map. The drawing parameter map contains drawing parameters corresponding to area densities for each region on a transfer mask. Of course, the drawing parameter map creating process (97) can be omitted.

According to this embodiment as mentioned above, even if the scanning exposure system uses different focus positions due to pattern densities, it is possible to correct focus position misalignment and provide precision patterning.

(Fifth embodiment)

This embodiment relates to a modification of the first embodiment. This embodiment is characterized by placement of beam adjustment openings on a second aperture. In the first embodiment, beam adjustment openings are placed at the periphery of the second aperture 15. In this embodiment, beam adjustment openings are placed between aperture groups.

FIGS. 20A through 20D show examples of pattern placement on the second aperture 15.

Figures 20A, 20B, 20C, 20D:
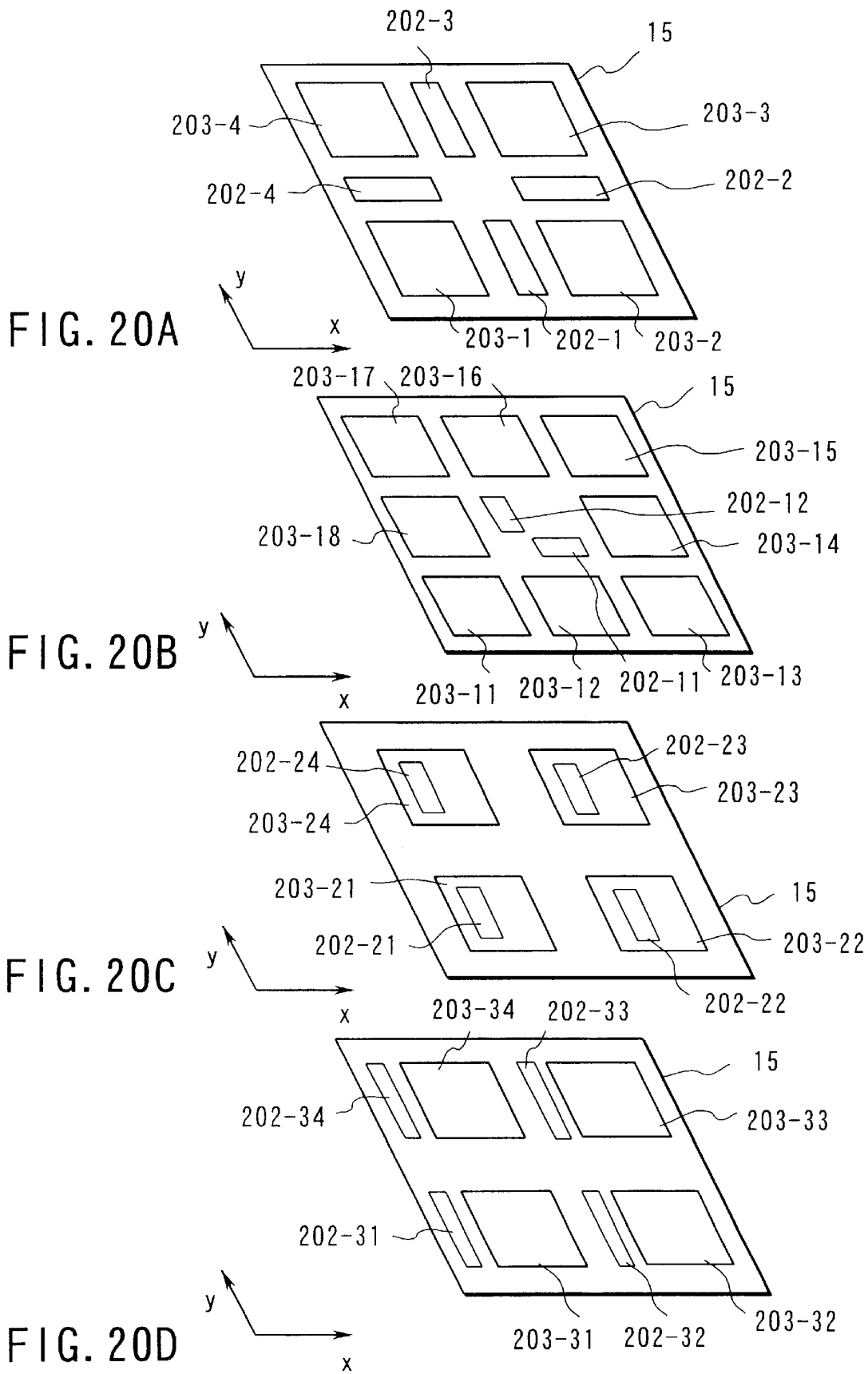
FIGS. 20A through 20D show an example of a pattern arrangement for a second aperture according to a fifth embodiment of the present invention.

In FIG. 20A, the second aperture 15 is provided with four exposure opening groups 203-1 through 203-4. Each one of beam adjustment opening groups 202-1 through 202-4 is placed between two of these exposure opening groups 203-1 through 203-4. The beam adjustment opening groups 202-1 through 202-4 extend from the center of the second aperture 15 toward mask peripheries in four directions. The overall portion of the beam adjustment opening groups 202-1 through 202-4 are not laid out near peripheries of the mask 201. The beam adjustment opening groups 202-2 and 202-4 are used for beam adjustment in the x direction. The beam adjustment opening groups 202-1 and 202-3 are used for beam adjustment in the y direction. A plurality of CP apertures (not shown) are provided in each of opening groups 203-1 through 203-4. A plurality of beam adjustment openings are provided in each of beam adjustment opening groups 202-1 through 202-4. Each beam adjustment opening has the same structure as described in the first embodiment. The same applies to the following embodiments.

In FIG. 20B, the second aperture 15 is provided with eight exposure opening groups 203-11 through 203-18. Beam adjustment opening groups 202-11 and 202-12 are provided so that they are surrounded by these eight exposure opening groups. The beam adjustment opening groups 202-11 and 202-12 are provided at the center of the second aperture 15. The opening group 202-11 is used for beam adjustment in the x direction. The opening group 202-12 is used for beam adjustment in the y direction. A plurality of CP apertures (not shown) are provided in each of opening groups 203-11 through 203-18.

In FIG. 20C, the second aperture 15 is provided with four exposure opening groups 203-21 through 203-24. Corresponding to these opening groups 203-21 through 203-24, each of beam adjustment opening groups 202-21 through 202-24 is provided in each of the corresponding opening groups.

In FIG. 20D, the second aperture 15 is provided with four exposure opening groups 203-31 through 203-34. Corresponding to these opening groups 203-31 through 203-34, each of beam adjustment opening groups 202-31 through 34 is provided adjacent to each of the corresponding opening groups.

The following describes effects of this embodiment using apertures in FIG. 20B as an example in comparison with FIG. 8 for the first embodiment.

When a CP aperture is changed during pattern exposure, for example, a beam adjustment is performed during the changeover. There is a difference in distances the second aperture 15 moves between the case where the second aperture 15 in FIG. 8 is used and the case where the second aperture 15 in FIG. 20B is used.

Figure 21A:
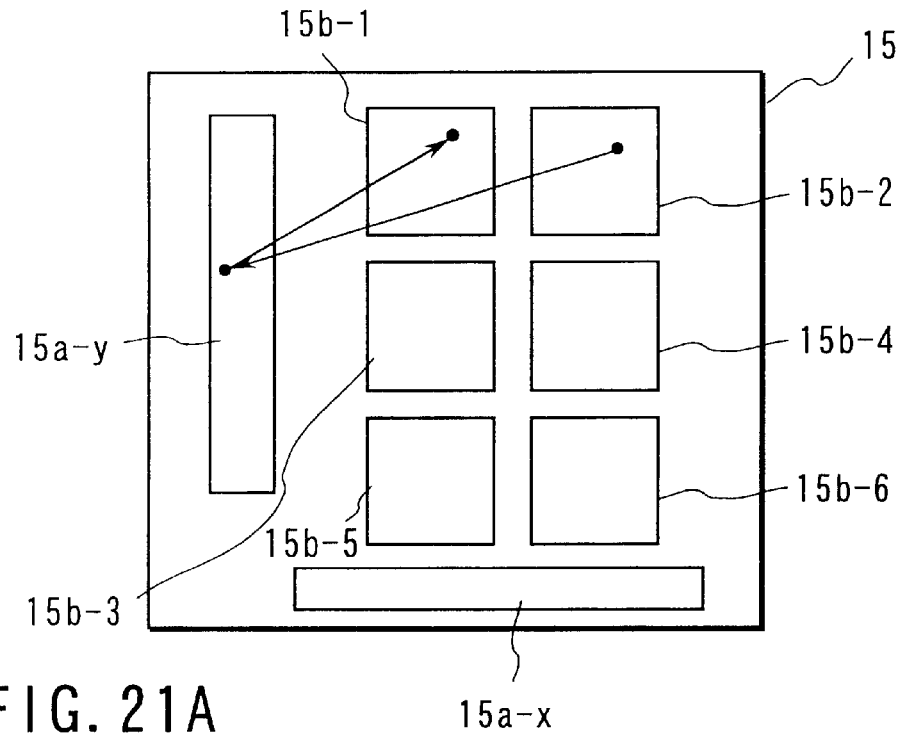
FIGS. 21A and 21B illustrate advantages of the pattern arrangement according to the fifth embodiment.
Figure 21B:
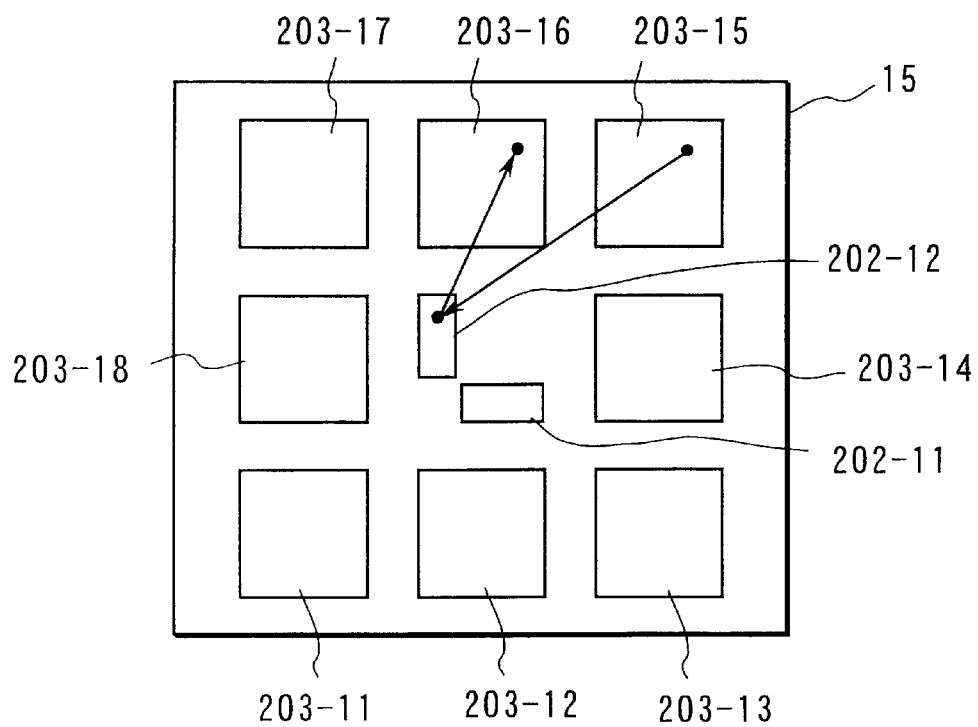

The following describes the difference in distances with reference to FIGS. 21A and 21B. FIG. 21A is a schematic representation of the aperture 15 in FIG. 8. FIG. 21B shows the aperture 15 in FIG. 20B. An arrow in FIG. 21A shows how a beam irradiation position moves. In this example, a given CP aperture in the group 15b-2 is exposed. Then, a beam adjustment is performed for a given beam adjustment opening in the beam adjustment opening group 15a-y. Finally, a given CP aperture is exposed in the group 15b-1. The aperture 15 must be moved accordingly. Since the beam adjustment opening group 15a-y is provided at the edge of the aperture 15, a distance to a relatively remote group such as 15b-2 is longer than a distance to an adjacent group such as 15b-1.

By contrast, a pattern placement for the aperture 15 in FIG. 21B shortens a distance for beam irradiation positions. An arrow in FIG. 21B shows how a beam irradiation position moves. In this example, a given CP aperture in the group 203-15 is exposed. Then, a beam adjustment is performed for a given beam adjustment opening in the beam adjustment opening group 202-12. Finally, a given CP aperture is exposed in the group 203-16. The aperture 15 must be moved accordingly. In this case, the beam adjustment opening group 202-12 is placed at the center of the aperture 15, and adjacently to all groups 203-11 through 203-18.

Accordingly, a distance for beam irradiation positions is shorter than a distance shown in FIG. 21A. Therefore, a distance for the aperture 15 is also shortened.

As mentioned above, the pattern placement for apertures in FIG. 20B shortens a distance between apertures and therefore completes the beam adjustment in a short time. This also increases working efficiency of the exposure apparatus and productivity of the charge beam exposure. Apparently, a similar effect is available not only in FIG. 20B, but also in FIGS. 20A, 20C, and 20D. This embodiment is not limited to structures in FIGS. 20A through 20D.

(Sixth Embodiment)

This embodiment is characterized by monitoring a contamination situation of a second aperture and always using the second aperture under a clean condition.

When an electron beam exposure is performed, carbon fluoride in a vacuum is deposited on the second aperture at a location where an electron beam is irradiated. A deposit developed on the second aperture easily causes a change in the aperture size or beam defocusing due to an electrostatic charge. It is necessary to periodically replace apertures or remove deposits by flowing reactive gas such as oxygen plasma and CF gas in the exposure apparatus.

In this embodiment, an aperture's contamination state is monitored by measuring an amperage at a beam adjustment opening. The amperage is measured on the basis of the amount of electrons reflected on the wafer. Structures of the second aperture and the exposure apparatus used for this embodiment are same as those in FIGS. 7 and 8.

Figure 22A:
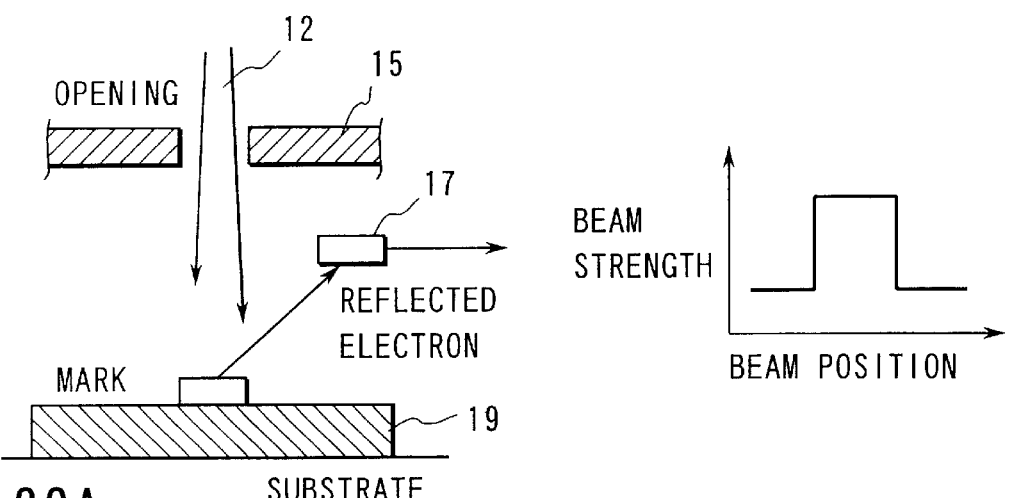
FIGS. 22A through 22C illustrate a principle of contamination situation monitoring for a second aperture according to a sixth embodiment of the present invention.
Figure 22B:
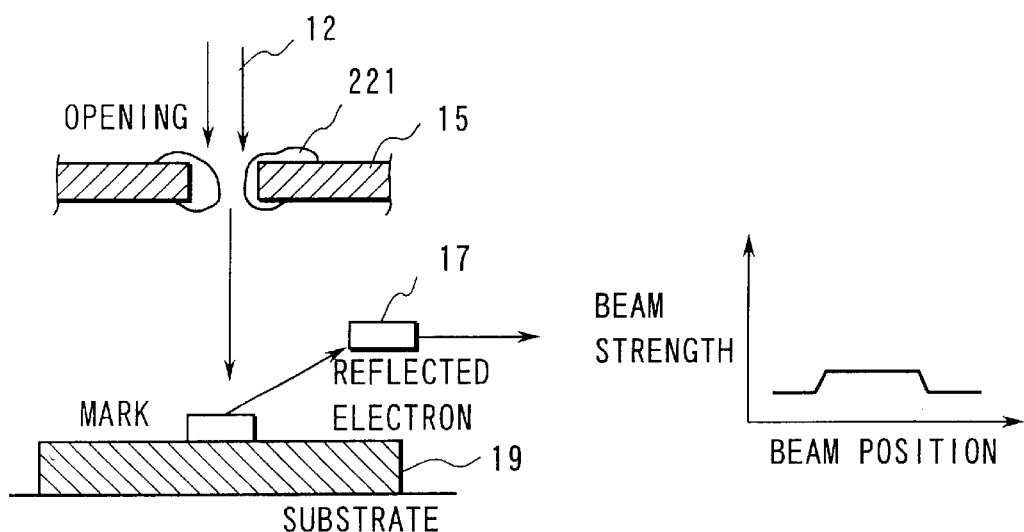
Figure 22C:
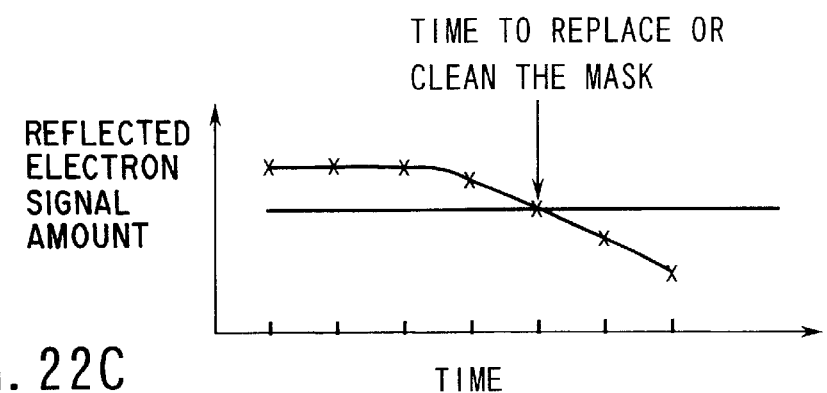

The following describes a principle of monitoring a contamination situation with reference to FIGS. 22A through 22C.

As shown in FIG. 22A, the electron beam 12 passes through a beam adjustment opening in the second aperture 15 and then is irradiated onto the wafer 19 on the stage 18. The detector 17 detects an electron reflected on the wafer 19. FIG. 22A shows a signal detected by the detector 17. The abscissa axis represents beam positions. The ordinate axis represents reflected electron signal strengths.

When the second aperture 15 is contaminated, contamination 221 is adhered near the beam adjustment opening. When the electron beam 12 is irradiated with the contamination 221 adhered, a decreased amount of electrons reaches the wafer 19. Consequently, the detector 17 detects a decreased amount of reflected electrons. The detected signal strength decreases.

A comparison is made between a reflected electron signal strength with the second aperture 15 attached and a decrease reflected electron signal strength with the use of the aperture. Thus, the contamination situation can be monitored. The control computer 32 compares reflected electron signal strengths. The control computer 32 is provided with memory (not shown) which stores reflected electron signal strengths when the aperture is attached.

Figure 23:
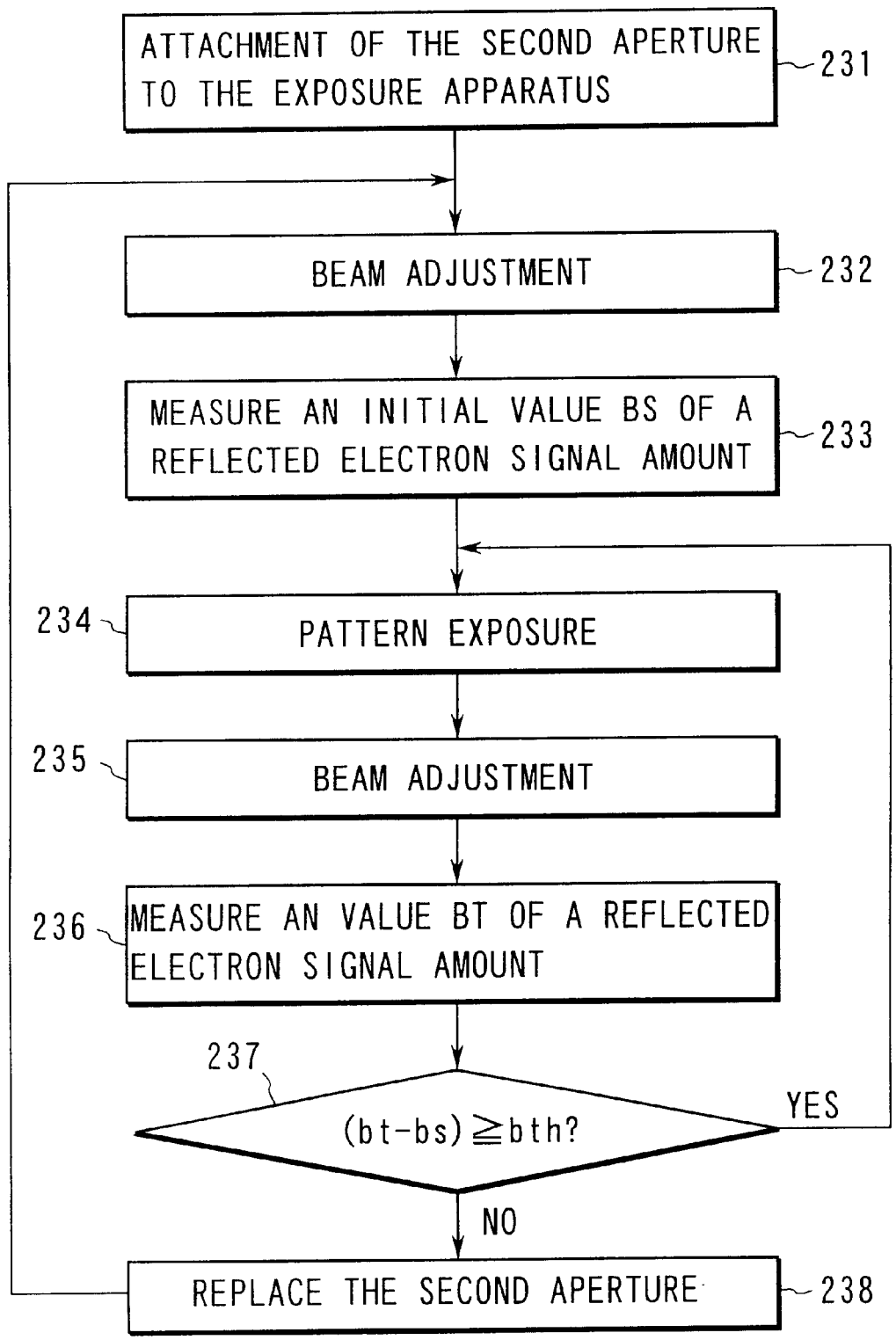
FIG. 23 is a flowchart for the contamination situation monitoring according to the sixth embodiment.

The following describes a charge beam exposure method according to this embodiment with reference to the flowchart in FIG. 23.

First, the second aperture 15 is attached to the exposure apparatus (231). A beam adjustment is performed for the beam adjustment opening with respective pattern density (232). A reflected electron signal amount is measured for the beam adjustment and is recorded as an initial value bs (233). At this time, the amplifier 36 should maintain a constant gain and level. It is also desirable to correct signal strength variations due to carbon contamination at marks on the side of the stage 18.

Then, a pattern exposure is performed on the basis of the adjusted beam parameters (234). When a new pattern is exposed, a new beam adjustment is performed (235). A reflected electron signal bt is measured for that beam adjustment (236). A calculation is made to find a difference between the measured reflected electron signal amount bt and the initial value bs. A comparison is made between the difference (bt−bs) and a specified threshold value bth. When the result satisfies the specified threshold value bth or more, control returns to the step for pattern exposure (234) based on the adjusted beam parameters. When the result is less than the specified threshold value bth, the contamination is assumed to be remarkable. The second aperture 15 is replaced (238).

FIG. 22C shows reflected electron signal amounts measured during the above-mentioned beam adjustments. The abscissa axis represents the time. The ordinate axis represents the reflected electron signal amount. It is found that the reflected electron signal amount decrease as time lapses. It is also found that the reflected electron signal amount is below the specified threshold value bth at a specified time.

The following describes a principle of another monitoring technique using reflected electron signal amounts with reference to FIG. 24. On the left of FIG. 24A, there is shown a beam adjustment opening with numerical aperture 100%. On the right, there is shown a beam adjustment opening with numerical aperture 10%. The electron beam 12 is irradiated so that it passes through the opening in FIG. 24A. Thereafter, as shown in FIG. 24B, the contamination 221 is build at the openings with the both numerical apertures 100% and 10%. When opening sizes differ, a smaller opening is more influenced by adhesion of the contamination 221. When the reflected electron signal amount decreases by 10% for the opening with the numerical aperture 100%, it decreases by more than 10% for the opening with the numerical aperture 10%.

Figure 24A:
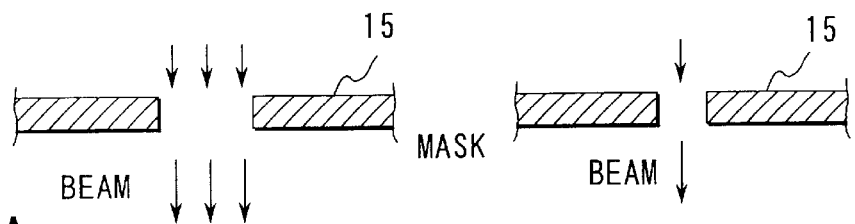
FIGS. 24A through 24D illustrate a principle of contamination situation monitoring according to a modification of the sixth embodiment.
Figure 24B:
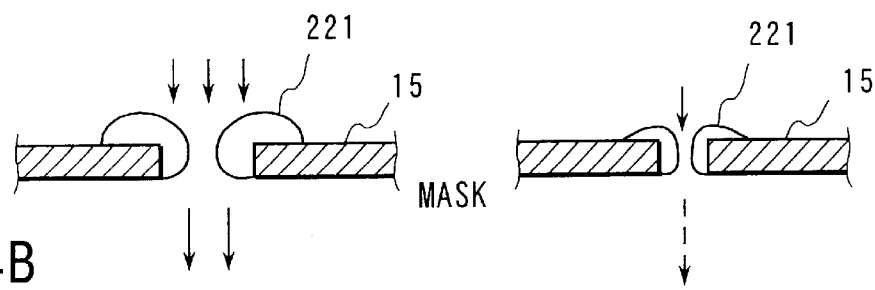
Figure 24C:
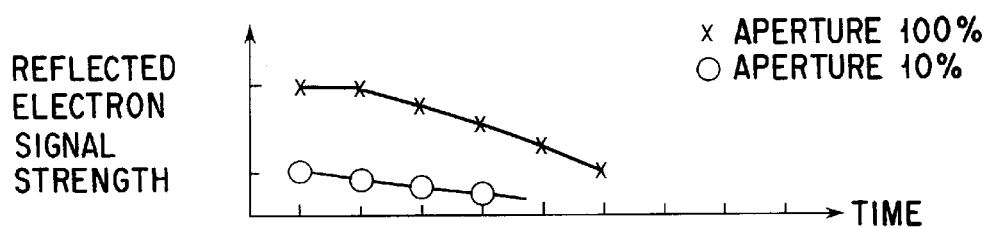

FIG. 24C shows the relationship between the time and a reflected electron signal strength. As shown in FIG. 24C, reflected electron signal strengths decrease for numerical apertures 10% and 100% according to the time lapse. However, the reflected electron signal strength for the numerical aperture 10% decreases more remarkably than the reflected electron signal strength for the numerical aperture 100%.

Figure 24D:
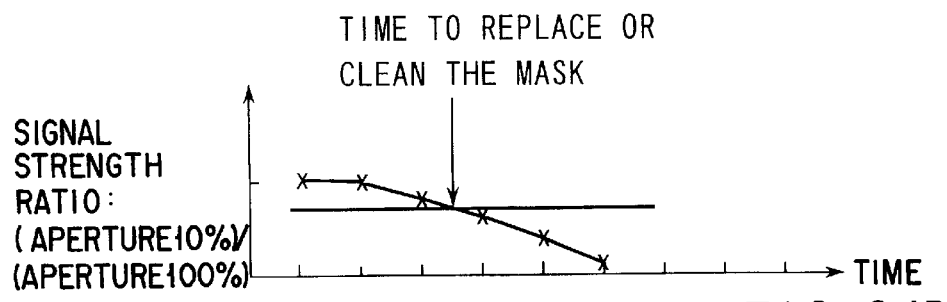

FIG. 24D shows a ratio of reflected electron signal strengths for numerical aperture 10% to reflected electron signal strengths for numerical aperture 100%. The abscissa axis represents the time. The ordinate axis represents "reflected electron signal strength for the numerical aperture 10%" divided by "reflected electron signal strength for the numerical aperture 100%". AS shown in FIG. 24D, the reflected electron signal strength ratio decreases as the time elapses. Accordingly, it is possible to monitor a contamination situation by measuring amount ratios of reflected electron signals which passed through openings with the different numerical apertures.

For example, there may be the case where the reflected electron signal strength for the numerical aperture 10% decreases 8% with reference to the reflected electron signal strength for the numerical aperture 100%. In this case, a threshold value for that strength ratio is set to 0.08. When the strength ratio becomes below this threshold value, the mask is replaced.

According to this embodiment, beam adjustment openings provided on the second aperture are used for measuring chronological changes in the reflected electron signal amount of beams that pass these openings. This makes it possible to determine an optimal time to replace and clean the second aperture. Furthermore, a calculation is performed to find signal strength ratios for two or more openings with different pattern densities. This makes it possible to more accurately evaluate degrees of mask contamination, thus preventing degradation of pattern accuracies due to mask contamination and improving productivity during electron beam exposure.

The above-mentioned embodiment monitors a contamination situation by measuring reflected electron signal amount. In addition, other parameters may be measured for monitoring. For example, a Faraday cup may be used for measuring an amperage flowing at each opening.

This embodiment may be applied to the exposure apparatus presented in the fourth embodiment. Moreover, an exposure amount may be corrected on the basis of changes in reflected electron signal amounts or beam currents. For example, when a signal strength decreases 10% compared to the state just after the second aperture is replaced, an exposure amount may be increased to compensate the decreased strength. This provides precision patterning.

As mentioned above, the present invention predefines an optimum beam adjustment parameter corresponding to the pattern density. A pattern exposure is performed after creating a drawing parameter table based on this beam adjustment parameter. An exposure operation allows an optimum beam adjustment parameter corresponding to the pattern density to be selected from the drawing parameter table. Therefore, it is possible to provide precision patterning by decreasing dimensional differences due to pattern density differences, drawing position fluctuations, and the like.

Further, it is needless to find beam adjustment parameters for all pattern exposure opening. A beam adjustment is available by finding beam adjustment parameters only for representative points according to pattern densities. It is possible to provide an easy beam adjustment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charge beam exposure apparatus, comprising:
a mask having a plurality of patterns with different pattern densities;
a stage provided with a substrate to which the pattern is transferred; and
a controller which has a drawing parameter table for storing an optimum beam adjustment parameter corresponding to the charge beam for each pattern density and adjusts a charge beam irradiated onto the substrate on the basis of the drawing parameter table, wherein
an optimum beam adjustment parameter corresponding to a pattern density is selected from the drawing parameter table for each of the patterns to transfer patterns.

2. A charge beam exposure apparatus according to claim 1, wherein:
the drawing parameter table is created on the basis of a result from a reflected electron signal with respect to at least the two patterns; wherein
the reflected electron signal is obtained by scanning a beam adjustment mark through the use of a charge beam passing through the pattern with a beam adjustment parameter varied; and wherein
the beam adjustment mark is formed with a shape corresponding to the pattern on one of the stage and the substrate.

3. A charge beam exposure apparatus according to claim 1, wherein:
the drawing parameter table is created on the basis of a result from a reflected electron signal with respect to at least the two patterns; wherein the reflected electron signal is obtained by scanning a beam adjustment mark through the use of a charge beam passing the pattern with a beam adjustment parameter varied; wherein the beam adjustment mark is formed with a shape corresponding to the pattern on one of the stage and the substrate; and wherein the beam adjustment mark has a shape similar to the corresponding pattern previously formed on one of the substrate and the stage.

4. A charge beam exposure apparatus according to claim 1, wherein:

the drawing parameter table is created on the basis of a result from a reflected electron signal with respect to at least the two patterns; wherein the reflected electron signal is obtained by scanning a beam adjustment mark through the use of a charge beam passing the pattern with a beam adjustment parameter varied; wherein the beam adjustment mark is formed with a shape corresponding to the pattern on one of the stage and the substrate; and wherein the beam adjustment mark is formed by transferring the pattern and has a shape similar to the pattern.

5. A charge beam exposure apparatus according to claim 1, wherein:

the mask comprises a plurality of beam adjustment openings with different pattern densities and a plurality of pattern exposure openings used for pattern exposure.

6. A charge beam exposure apparatus according to claim 1, wherein:

the mask comprises a plurality of beam adjustment openings with different pattern densities and a plurality of pattern exposure openings used for pattern exposure; and wherein at least one of the beam adjustment openings is placed between a plurality of the pattern exposure openings.

7. A charge beam exposure apparatus according to claim 1, wherein:

the mask comprises a plurality of beam adjustment openings with different pattern densities and a plurality of pattern exposure openings used for pattern exposure; wherein there are constructed at least two pattern exposure opening groups each of which comprises at least two of a plurality of the pattern exposure openings; and wherein at least one of the beam adjustment opening is placed between a plurality of the pattern exposure opening groups.

8. A charge beam exposure apparatus according to claim 1, wherein:

the mask comprises a plurality of beam adjustment openings with different pattern densities and a plurality of pattern exposure openings used for pattern exposure; wherein there are constructed at least two pattern exposure opening groups each of which comprises at least two of a plurality of the pattern exposure openings; and wherein at least one of the beam adjustment opening is placed near the center of the mask away from a plurality of the pattern exposure opening groups.

9. A charge beam exposure apparatus comprising:

a mask having a plurality of patterns with different pattern densities;

a stage provided with a substrate to which the pattern is transferred; and a controller which adjusts a charge beam irradiated onto the substrate for each of a plurality of pattern densities, wherein the controller monitors a contamination situation of the mask based on the amount of electrons passing through the mask pattern.

10. A charge beam exposure apparatus according to claim 9, further comprising:

a detector which detects an electron reflected from the substrate and outputs the detected signal to the controller, wherein the controller monitors a contamination situation of the mask based on the detected signal.

11. A charge beam exposure method for applying a beam adjustment to a mask having a plurality of patterns with at least two pattern densities for each of the patterns and transferring a pattern onto a sample surface by irradiating a charge beam, comprising:

a first process of irradiating a charge beam onto a plurality of beam adjustment marks which are formed by transferring the pattern with a plurality of different pattern densities onto the sample surface or are formed with almost the same shape as the pattern already transferred onto the sample surface, detecting an electron reflected from the sample surface by varying a beam adjustment parameter for each of the patterns corresponding to the beam adjustment mark, and finding an optimum beam adjustment parameter;

a second process of creating a drawing parameter table which stores the optimum beam adjustment parameter using a pattern density as a parameter; and a third process of selecting the optimum beam adjustment parameter based on the drawing parameter table and transferring the pattern onto the sample surface.

12. A charge beam exposure method according to claim 11, wherein:

the mask is provided with a plurality of beam adjustment openings having a plurality of pattern densities and is provided with the beam adjustment mark formed by the beam adjustment opening.

13. A charge beam exposure method according to claim 11, wherein:

the optimum beam adjustment parameter is determined by a beam adjustment parameter which obtains maximum value with respect to reflected electron signal amounts from the sample surface.

14. A charge beam exposure method according to claim 11, wherein:

the mask has a plurality of beam adjustment openings with different pattern densities and a plurality of pattern exposure openings used for pattern exposure; and wherein at least one of the beam adjustment openings is placed between a plurality of the pattern exposure openings.

15. A charge beam exposure apparatus according to claim 11, wherein:

the mask has a plurality of beam adjustment openings with different pattern densities and a plurality of pattern exposure openings used for pattern exposure; wherein there are constructed at least two pattern exposure opening groups each of which comprises at least two of a plurality of the pattern exposure openings; and wherein at least one of the beam adjustment opening is placed between a plurality of the pattern exposure opening groups.

16. A charge beam exposure mask according to claim 15, wherein:
   at least one of the beam adjustment openings is placed between a plurality of the pattern exposure openings.

17. A charge beam exposure mask according to claim 15, wherein:
   there are constructed at least two pattern exposure opening groups each of which comprises at least two of a plurality of the pattern exposure openings; and wherein
   at least one of the beam adjustment opening is placed between a plurality of the pattern exposure opening groups.

18. A charge beam exposure mask according to claim 15, wherein:
   there are constructed at least two pattern exposure opening groups each of which comprises at least two of a plurality of the pattern exposure openings; and wherein
   at least one of the beam adjustment opening is placed near the center of the mask away from a plurality of the pattern exposure opening groups.

19. A charge beam exposure apparatus according to claim 11, wherein:
   the mask has a plurality of beam adjustment openings with different pattern densities and a plurality of pattern exposure openings used for pattern exposure; wherein there are constructed at least two pattern exposure opening groups each of which comprises at least two of a plurality of the pattern exposure openings; and wherein
   at least one of the beam adjustment opening is placed near the center of the mask away from a plurality of the pattern exposure opening groups.

20. A charge beam exposure method for applying a beam adjustment to a mask having a plurality of patterns with at least two pattern densities for each of the patterns and transferring a pattern onto a sample surface by irradiating a charge beam,
   wherein a contamination situation of the mask is monitored based on the amount of electrons passing the mask pattern.

21. A charge beam exposure mask, comprising:
   a plurality of beam adjustment openings which are provided for adjusting irradiation conditions and have different pattern densities; and
   a plurality of pattern exposure openings used for pattern exposure.

* * * * *

UNITED STATES PATENT AND TRADEMARK OFFICE
CERTIFICATE OF CORRECTION

PATENT NO. : 6,507,034 B1
DATED : January 14, 2003
INVENTOR(S) : Nakasugi

It is certified that error appears in the above-identified patent and that said Letters Patent is hereby corrected as shown below:

Column 19,
Line 49, "one of the beam adjustment opening" should read -- one of the beam adjustment openings --.
Line 62, "one of the beam adjustment opening" should read -- one of the beam adjustment openings --.

Column 20,
Line 65, "one of the beam adjustment opening" should read -- one of the beam adjustment openings --.

Column 21,
Line 10, "one of the beam adjustment opening" should read -- one of the beam adjustment openings --.
Line 19, "one of the beam adjustment opening" should read -- one of the beam adjustment openings --.

Column 22,
Line 4, "one of the beam adjustment opening" should read -- one of the beam adjustment openings --.

Signed and Sealed this

Fifteenth Day of April, 2003

JAMES E. ROGAN
*Director of the United States Patent and Trademark Office*